United States Patent
Dorough et al.

(10) Patent No.: US 7,383,147 B2
(45) Date of Patent: Jun. 3, 2008

(54) DYNAMICALLY ADAPTABLE SEMICONDUCTOR PARAMETRIC TESTING

(75) Inventors: Michael J. Dorough, Meridian, ID (US); Robert G. Blunn, Boise, ID (US); Sergey A. Velichko, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 299 days.

(21) Appl. No.: 11/342,425

(22) Filed: Jan. 30, 2006

(65) Prior Publication Data

US 2006/0125509 A1 Jun. 15, 2006

Related U.S. Application Data

(60) Division of application No. 10/924,695, filed on Aug. 24, 2004, now Pat. No. 7,139,672, which is a continuation of application No. 10/133,685, filed on Apr. 25, 2002, now Pat. No. 7,162,386.

(51) Int. Cl.
*G06F 19/00* (2006.01)
(52) U.S. Cl. ...................................... 702/118; 702/117
(58) Field of Classification Search ................ 324/512, 324/523, 527; 438/6, 11, 12, 13; 702/117, 702/118
See application file for complete search history.

(56) References Cited

U.S. PATENT DOCUMENTS

| | | |
|---|---|---|
| 4,012,625 A * | 3/1977 | Bowen et al. ............... 714/734 |
| 4,517,512 A | 5/1985 | Petrich et al. |
| 4,639,664 A | 1/1987 | Chiu et al. |
| 4,656,632 A | 4/1987 | Jackson |
| 4,896,269 A | 1/1990 | Tong |
| 4,985,988 A | 1/1991 | Littlebury |
| 5,059,899 A | 10/1991 | Farnworth et al. |
| 5,078,257 A | 1/1992 | Carter, Jr. |
| 5,083,364 A | 1/1992 | Olbrich et al. |
| 5,088,045 A | 2/1992 | Shimanaka et al. |
| 5,177,688 A | 1/1993 | Rentschler et al. |
| 5,206,582 A | 4/1993 | Ekstedt et al. |
| 5,241,266 A | 8/1993 | Ahmad et al. |
| 5,326,428 A | 7/1994 | Farnworth et al. |

(Continued)

OTHER PUBLICATIONS

Blunn, R G., "Concurrent fault tolerant control of semiconductor measurement and testing", *2001 IEEE International Semiconductor Manufacturing Symposium*, (Oct. 8-10, 2001),455-458.

(Continued)

*Primary Examiner*—John Barlow
*Assistant Examiner*—Douglas N Washburn
(74) *Attorney, Agent, or Firm*—Schwegman, Lundberg & Woessner, P.A.

(57) ABSTRACT

An apparatus, method, system, and signal-bearing medium may provide multiple maps, which may include multiple probing sequences to be called upon at run-time based on statistical thresholds or other selected criteria. Each map may include a series of locations on a wafer, the tests to perform at each location, and the measured results of each test. A parametric test system may perform the test at the associated location on the wafer. If the statistical threshold is exceeded or the selected criteria is met, the current map may be abandoned in favor of a different map.

20 Claims, 24 Drawing Sheets

U.S. PATENT DOCUMENTS

| | | | |
|---|---|---|---|
| 5,360,747 A | | 11/1994 | Larson et al. |
| 5,457,400 A | | 10/1995 | Ahmad et al. |
| 5,483,175 A | | 1/1996 | Ahmad et al. |
| 5,491,427 A | | 2/1996 | Ueno et al. |
| 5,523,697 A | | 6/1996 | Farnworth et al. |
| 5,615,138 A | | 3/1997 | Tanaka et al. |
| 5,659,483 A | * | 8/1997 | Rhodes et al. ............. 702/57 |
| 5,726,920 A | | 3/1998 | Chen et al. |
| 5,736,850 A | | 4/1998 | Legal |
| 5,742,173 A | * | 4/1998 | Nakagomi et al. ......... 324/758 |
| 5,787,190 A | | 7/1998 | Peng et al. |
| 5,806,181 A | | 9/1998 | Khandros et al. |
| 5,822,717 A | | 10/1998 | Tsiang et al. |
| 5,845,234 A | | 12/1998 | Testa et al. |
| 5,859,964 A | | 1/1999 | Wang et al. |
| 5,869,974 A | | 2/1999 | Akram et al. |
| 5,931,952 A | | 8/1999 | Lesmeister |
| 5,943,230 A | | 8/1999 | Rinnen et al. |
| 5,962,862 A | | 10/1999 | Evers et al. |
| 5,991,699 A | | 11/1999 | Kulkarni et al. |
| 6,031,382 A | | 2/2000 | Nakaizumi |
| 6,113,646 A | | 9/2000 | Holden |
| 6,124,725 A | | 9/2000 | Sato |
| 6,208,904 B1 | | 3/2001 | Mullen, Jr. |
| 6,210,983 B1 | | 4/2001 | Atchison et al. |
| 6,240,331 B1 | | 5/2001 | Yun |
| 6,296,943 B1 | | 10/2001 | Watanabe et al. |
| 6,304,095 B1 | | 10/2001 | Miyamoto |
| 6,314,034 B1 | | 11/2001 | Sugamori |
| 6,331,783 B1 | | 12/2001 | Hauptman |
| 6,362,013 B1 | | 3/2002 | Yoshimura |
| 6,370,487 B1 | | 4/2002 | Dorough |
| 6,383,825 B1 | | 5/2002 | Farnworth et al. |
| 6,420,864 B1 | | 7/2002 | Abraham et al. |
| 6,445,199 B1 | | 9/2002 | Satya et al. |
| 6,462,575 B1 | | 10/2002 | Cram |
| 6,466,314 B1 | | 10/2002 | Lehman |
| 6,486,492 B1 | | 11/2002 | Su |
| 6,505,138 B1 | | 1/2003 | Leonard |
| 6,507,800 B1 | | 1/2003 | Sheu |
| 6,536,006 B1 | | 3/2003 | Sugamori |
| 6,549,863 B1 | | 4/2003 | Morinaga |
| 6,556,938 B1 | | 4/2003 | Rohrbaugh et al. |
| 6,563,331 B1 | | 5/2003 | Maeng |
| 6,567,770 B2 | | 5/2003 | Dorough |
| 6,590,408 B1 | | 7/2003 | Cheng et al. |
| 6,598,210 B2 | | 7/2003 | Miwa |
| 6,618,682 B2 | | 9/2003 | Bulaga et al. |
| 6,624,653 B1 | | 9/2003 | Cram |
| 6,625,556 B1 | | 9/2003 | Conboy et al. |
| 6,629,282 B1 | | 9/2003 | Sugamori et al. |
| 6,639,417 B2 | | 10/2003 | Takao |
| 6,675,138 B1 | | 1/2004 | Hollander et al. |
| 6,745,094 B1 | | 6/2004 | Harakawa et al. |
| 6,785,413 B1 | | 8/2004 | Barcomb et al. |
| 6,859,760 B2 | | 2/2005 | Dorough |
| 7,010,451 B2 | | 3/2006 | Dorough et al. |
| 2002/0000826 A1 | | 1/2002 | Takao |
| 2002/0111775 A1 | | 8/2002 | Dorough |
| 2002/0121915 A1 | | 9/2002 | Alonso et al. |
| 2002/0152046 A1 | | 10/2002 | Velichko et al. |
| 2002/0156548 A1 | | 10/2002 | Arackaparambil et al. |
| 2003/0028343 A1 | | 2/2003 | Velichko et al. |
| 2003/0200513 A1 | | 10/2003 | Bergman et al. |
| 2003/0208340 A1 | | 11/2003 | Dorough |
| 2003/0212469 A1 | | 11/2003 | Wang et al. |
| 2004/0153979 A1 | | 8/2004 | Chang |
| 2004/0210413 A1 | | 10/2004 | Dorough et al. |
| 2005/0021273 A1 | | 1/2005 | Dorough et al. |
| 2006/0122803 A1 | | 6/2006 | Dorough et al. |
| 2006/0212253 A1 | | 9/2006 | Velichko et al. |
| 2007/0112538 A1 | | 5/2007 | Velichko et al. |

OTHER PUBLICATIONS

Cheung, D., et al., "The INMOS Integrated Parametric Test and Analysis System", *Proceedings IEEE 1989 International Conference on Microelectronic Test Structures*, vol. 2(1), (Mar. 13-14, 1989),45-50.

Dorough, Michael J., et al., "Dynamic Adaptable Semiconductor Testing", *IEEE Proceedings of the 2002 International Symposium on Semiconductor Manufacturing, ISSM Catalog*, (2002),1-4.

Fukuda, E., et al., "Advanced Process Control System Description of an Easy-to-use Control System Incorporating Pluggable Modules", *IEEE Intn'l Symposium on Semiconductor Manufacturing Conference Proceesings*, (Oct. 11-13, 1999),321-324.

Granieri, M. N., "System Engineering Considerations and Methodology for Effecting a Cohesive Functional/Parametric Testing Strategy", *IEEE Automatic Testing Conference*, (Sep. 25-28, 1989),1-8.

Hamilton, A., et al., "An Expert System for Process Diagnosis [MOS Product Testing]", *Proceedings IEEE 1989 International Conference on Microelectronic Test Structures*, vol. 2(1), (Mar. 13-14, 1989),55-57.

Madge, R., et al., "In Search of the Optimum Test Set—Adaptive Test Methods For Maximum Defect Coverage and Lowest Test Cost", *IEEE International Test Conference*, (Oct. 26-28, 2004).

Perez, R. A., et al., "Integrating Expert Systems With A Relational Database In Semiconductor Manufacturing", *IEEE Transactions on Semiconductor Manufacturing*, vol. 6(3), (Aug. 3, 1993),199-206.

Sedgewick, R., *Algorithms*, Second Edition, Addison-Wesley Publishing Company, Inc.,(1989),pp. 516-519.

Weber, C, "Standardization of CMOS Unit Process Development", *Proceedings IEEE 1989 International Conference on Microelectronic Test Structures*, (Mar. 13-14, 1989),39-44.

Gries, D, et al., "Chapter 9—Predicate Calculus", *A Logical Approach to Discrete Math*, New York: Springer-Verlag,(1993),157-71.

"Application Partial File History U.S. Appl. No. 10/133,685", (as of Oct. 31, 2007),251 pgs.

"Application Partial File History U.S. Appl. No. 10/924,695", (as of Oct. 31, 2007),138 pgs.

"Application Partial File History U.S. Appl. No. 11/342,419", (as of Oct. 31, 2007),80 pgs.

* cited by examiner

|  | BADSITE INPUTS 702 ||||||
|---|---|---|---|---|---|---|
|  | MULTIPLE MAPS ||  |  |  |  |
| CONDITION | PARTIAL 704 | COMPLETE 706 | UPDATE BADWAFER 708 | SITEPAUSE 710 | >=BAD SITE % 712 | >= SITERETRY LOCKOUT 714 |
| 48 | F | F | F | T | T | F |
| 176 | F | T | F | T | T | F |
| 304 | T | F | F | T | T | F |

| BADSITE OUTPUTS & ACTION SEQUENCE 718 | | | | | | BADWAFER INPUTS 720 | | | BADWAFER OUTPUTS & ACTION SEQUENCE 722 | | | | | MMAP OUTPUTS & ACTION SEQUENCE 724 | |
|---|---|---|---|---|---|---|---|---|---|---|---|---|---|---|---|
| FIRST PAGE 726 | SECOND (!) PAUSE 728 | SECOND PASSWORD LOCKOUT 730 | THIRD RESET BADSITE COUNTER 732 | FOURTH INCREMENT BADWAFER COUNTER 734 | END OF RUN HOLD LOT 736 | WAFER PAUSE 738 | >=BAD WAFER % 740 | >= WAFER % LOCKOUT 742 | FIRST RESET BADWAFER COUNTER 744 | SECOND PAUSE 746 | SECOND (!) PASSWORD LOCKOUT 748 | FIRST PAGE 750 | END OF RUN HOLD LOT 752 | THIRD NEXT MAP ENABLED 754 | THIRD SWITCH TO NEXT MAP 756 |
| F | T | F | T | F | F | F | F | F | F | F | F | F | F | F | F |
| F | T | F | T | F | F | F | F | F | F | F | F | F | F | F | F |
| F | T | F | T | F | F | F | F | F | F | F | F | F | F | T | F |

DYNAMICALLY ADAPTABLE SEMICONDUCTOR PARAMETRIC TESTING

CROSS REFERENCE TO RELATED APPLICATIONS

This application is a divisional of U.S. application Ser. No. 10/924,695 filed Aug. 24, 2004, (U.S. Pat. No. 7,139,672), which is a continuation of U.S. application Ser. No. 10/133,685 filed Apr. 25, 2002, (U.S. Pat. No. 7,162,386), which applications are incorporated herein by reference.

This invention is also related to:

U.S. application Ser. No. 08/984,726, filed Dec. 4, 1997 (U.S. Pat. No. 6,113,646), titled "Method of Selecting Layout of Integrated Circuit Probe Card;"

U.S. application Ser. No. 09/834,751, filed Apr. 13, 2001, titled "Concurrent Control of Semiconductor Parametric Testing;"

U.S. application Ser. No. 10/131,934, filed Apr. 25, 2002, titled "Intelligent Measurement Modular Semiconductor Parametric Test System;" and U.S. application Ser. No. 10/417,640, filed Apr. 17, 2003, (U.S. Pat. No. 7,010,451), titled "Dynamic Creation and Modification of Wafer Test Maps During Wafer Testing."

FIELD OF THE INVENTION

The invention relates generally to testing semiconductors, and more specifically to dynamically adaptable parametric testing of semiconductors.

BACKGROUND OF THE INVENTION

Fabrication of semiconductors typically comprises many steps, including creation of a silicon wafer, deposition of various materials onto the wafer, ion implantation into the wafer, etching away material applied to the wafer, and other similar processes. These processes are used to create the electronic components and connections on the wafer that form a useful electronic circuit.

As these processes are performed on the wafer, the wafer may be subjected to parametric testing. Parametric testing involves testing the electronic parameters of the circuitry on the wafer, such as by applying current or voltage, and by measuring resistance, capacitance, current, voltage, or other such electrical parameters. These tests are used to ensure that a fabricated structure on the semiconductor meets the specifications and requirements of the semiconductor manufacturer, and falls within acceptable tolerances.

Parametric testing can take place during the fabrication process to ensure that each stage of fabrication is successful, and is usually performed on the completed wafer to ensure that each completed circuit on the wafer is functional and meets specified performance criteria.

This parametric testing is typically performed with a parametric test system, which comprises several parts. Such systems may be capable of loading a wafer from a wafer tray to a wafer chuck, which is then positioned by a wafer positioner to a proper alignment under a test pin. Once the equipment has properly loaded and moved the wafer into position, parametric test instrumentation systems are initialized and operated to apply electrical signals, heat, and other stimuli as needed to the wafer. The test instrumentation also then takes measurements of parameters, such as impedance and current or voltage measurement, and the test system analyzes and records the results of the parametric tests.

Although parametric testing is typically used to verify the parameters or performance of production semiconductors, such testing can also be critical in investigating the usability or performance characteristics of new materials or new circuit structures. A wide variety of tests, including resistance, capacitance, transistor characteristic, thermal characteristic, and other tests enable characterization of these new materials and circuits, as well as verification of performance in a production environment.

Testing a single wafer can involve tens of thousands of measurements per wafer, with dozens of wafers per manufacturing lot or wafer tray loaded for test. Because this results in literally millions of parametric tests and measurements that must be performed per wafer lot, the time that such testing requires is an important factor in the productivity of a wafer or semiconductor fabrication facility.

It is therefore desirable to operate a semiconductor parametric test system that minimizes the time required to perform semiconductor parametric testing without sacrificing the capability to adequately identify the performance characteristics of the product under test.

SUMMARY OF THE INVENTION

An apparatus, method, system, and signal-bearing medium may provide multiple maps, which may include multiple probing sequences to be called upon at run-time based on statistical thresholds. Each map may include a series of locations on a wafer, the test to perform at each location, and the measured results of each test. A prober may perform the test at the associated location on the wafer. If the statistical threshold is exceeded or a certain criteria is met, the current map may be abandoned in favor of a different map.

BRIEF DESCRIPTION OF THE FIGURES

FIGS. 7A and 7B depict a fragment of a Multiple Map Truth Table, according to an embodiment of the invention.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

Figure 1:
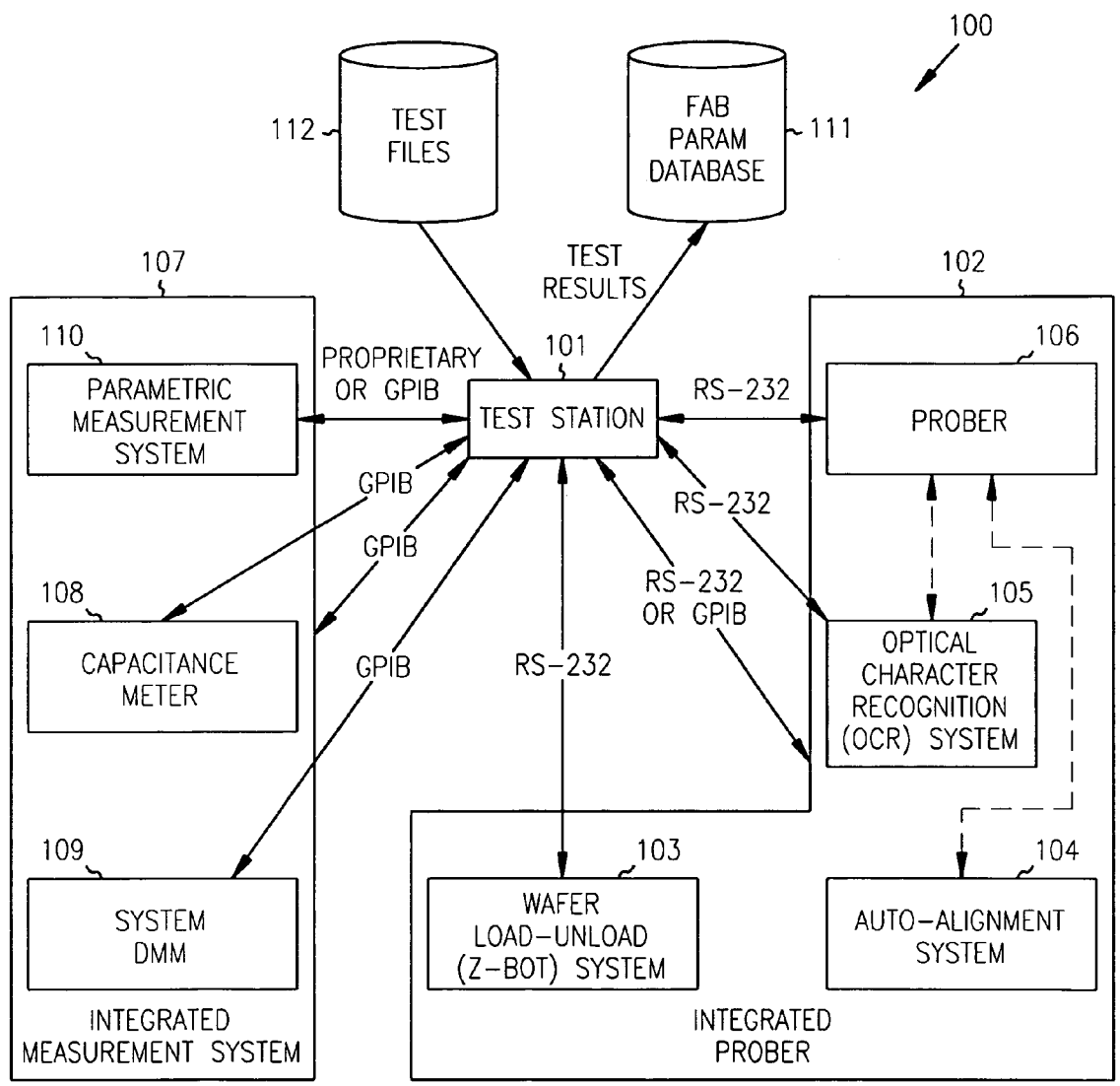
FIG. 1 depicts a block diagram of the components of a parametric test system, according to an embodiment of the invention.

FIG. 1 depicts a block diagram of a parametric test system 100, according to an embodiment of the invention. A test station 101 is connected to an integrated prober 102, which provides wafer movement capability. The integrated prober 102 comprises a wafer loader 103, an auto-alignment system 104 for aligning wafers, an optical character recognition system 105, and a prober 106. The prober 106 comprises test pins, as well as a wafer chuck and mover system that coordinates with the auto-alignment system 104 as shown.

The test station 101 is also connected to an integrated measurement system 107, which comprises a capacitance meter 108 and a digital multimeter 109. The integrated measurement system 107 also comprises a parametric measurement system 110, which is operable to perform additional measurements and tests.

The test station 101 also is operably connected to test files 112, which store parameters for the wafer under test. These parameters include definitions of the tests to be performed on the wafer and of the data to be collected during the wafer tests. Parameter database 111 stores information including in some embodiments of the invention the results of the tests, as well as statistics summarizing the test results.

The parametric test system 100 illustrated in FIG. 1 shows how the test instrumentation system of an embodiment of the invention comprises an integrated measurement system and an integrated prober system. These systems in some embodiments of the invention may be integrated with each other in ways not reflected in the drawing; for example, the wafer chuck of the integrated prober part of the semiconductor test equipment system may be heated or cooled by the integrated measurement system or another part of the parametric instrumentation system. The operation of these various systems is controlled and coordinated in some embodiments by a test station controller, which can be pictured for purposes of FIG. 1 as the test station 101.

In an embodiment, the test station 101 may read maps from the test files 112, perform the tests specified in the maps on a wafer via the test station 101 and the integrated prober 102, may receive the results of the tests from the test station 101, and may store the results in the database 111. The test station 101 may include instructions stored on a machine-readable medium and capable of being executed on a processor. In another embodiment, the test station 101 may be implemented in hardware in lieu of a processor-based system. The functions of the test station 101 may include a parametric test control system. In another embodiment, the functions of the test station 101 may be distributed in the integrated measurement system 107 and/or the integrated prober 102.

As will be described in detail below, aspects of an embodiment pertain to specific apparatus and method elements implementable on an electronic device. In another embodiment, the invention may be implemented as a program product for use with an electronic device. The programs defining the functions of this embodiment may be delivered to an electronic device via a variety of signal-bearing media, which include, but are not limited to:

(1) information permanently stored on a non-rewriteable storage medium (e.g., read-only memory devices attached to or within an electronic device, such as a CD-ROM readable by a CD-ROM drive);

(2) alterable information stored on a rewriteable storage medium (e.g., a hard disk drive or diskette); or (3) information conveyed to an electronic device by a communications medium, such as through a electronic device or a telephone network accessed via a network, including wireless communications.

Such signal-bearing media, when carrying machine-readable instructions that direct the functions of the present invention, represent embodiments of the present invention.

Test files 112 may include multiple maps. Each map may include a series of locations, the test to perform at each location, and the measured results of each test. The test station 101 may read each location and instruct the integrated prober 102 to perform the associated test.

Multiple maps may include multiple probing sequences to be called upon at run-time based on statistical thresholds or other criteria that is not necessarily statistical. Without the multiple maps mechanism, there would be one and only one map that controls the integrated prober 102. With only one map, the probing sequence would be predestined at the start of each lot run and the single probing sequence would run to completion for each map. In contrast, with multiple maps, the parametric engineer can now think about many different probing movement patterns to be leveraged at lot run-time and for each of these maps, the engineer can specify whether or not the map needs to run to completion.

At lot run-time, the test station 101 swaps the currently selected map out for a new map. If a percent badsite threshold or percent bad wafer threshold is exceeded, the test station 101 may abandon the currently executing map in favor of a more aggressive map strategy. The parametric engineer may specify many potential maps with different probing patterns to test the part type for a given fabrication process step. Also, for each map strategy, the parametric engineer may designate whether or not the map is to be fully executed or partially executed. Consider the following scenarios:

Scenario 1. The system 100 tests wafers by probing a reduced number of test locations. If all test locations satisfy certain criteria, then the entire wafer is probed just using this reduced test plan. If the system 100 determines that a certain number of collected test information triggers under the specified condition, then it will perform more testing utilizing different probing sequences (or maps), and so on. Having the ability to probe using a reduced number of test locations will save overall test time for wafers and lots that would not trigger more thorough testing.

Scenario 2. The system 100 tests wafers using a first map. After partially completing the testing, the system 100 determines that test conditions trigger the use of a different test sequence. The system 100 abandons or stops using the first map and starts using a second map with a different test sequence from the first. The system 100 saves overall test time by not completing testing using the first map.

Formal Specification of Multiple Maps

The Multiple Map conceptual framework is specified using the following formal approach. The framework is specified starting with Primitives, Coordinates, Register, Measurement, Subsite, Site, Map, Badsite, Badwafer, and Optimal Prober Movement. Higher-level abstractions include Composite and Aggregate Multiple Maps, Partial and Full Completion. Finally the Multiple Map's lifetime dynamics and constraints are described.

Primitives

To formally specify multiple maps, predicate logic offers an extension of prepositional logic that allows variables other than a type Boolean. A predicate-calculus formula is a Boolean expression in which some Boolean variable may be replaced by predicates and/or universal and existential quantification. The symbol $\forall$, which is read as "for all", is called the universal quantifier: "for all x such that R holds, P holds." The symbol $\exists$, which is read as "there exists", is called the existential quantifier: "there exists an x in the range R such that P holds."

| Boolean Operators | |
|---|---|
| $\wedge$ | conjunction (and) |
| $\vee$ | disjunction (or) |
| $\neg$ | not |
| $\Rightarrow$ | implication, if p then q |
| = | equality |
| $\neq$ | inequality |
| $\equiv$ | equivalents |
| $\leq$ | less than or equal |
| $\geq$ | greater than or equal |
| Types | |
| Z | integers: . . . , −3, −2, −1, 0, 1, 2, 3, . . . |
| N | natural numbers: 0, 1, 2, . . . |
| Z+ | positive numbers: 1, 2, 3, . . . |
| Z− | negative integers: −1, −2, −3, . . . |
| Q | rationals i/j for i, j integers, j ≠ 0 |
| R | real numbers |
| R+ | positive real numbers |
| B | booleans: true, false |
| ADT | abstract data type |
| ($\forall$ x \| R : P) | universal quantification |
| ($\exists$ x \| R : P) | existential quantification |
| set(t) | set of elements of type t |
| {$e_1$:t, . . . , $e_n$:t} | set enumeration, returns set(t) |
| x:t $\in$ S:set(t) | set membership, returns B |
| S:set(t) = T:set(t) | set equality, returns B |
| # S:set(t) | set size, returns N |
| {x \| R: B : E:t } | describe a set by stating exclusive properties of elements |
| $\in$ | where type t is an element of a set |
| $\notin$ | where type t is not an element of the set |
| $\cup$ | union |
| $\cap$ | intersection |
| $\subset$ | subset |
| $\supset$ | superset |

Coordinates

A coordinate is a 2-tuple pair $\langle x, y \rangle$, where x and y can be two-dimensional integer coordinates, Z, or two-dimensional real coordinates, R. Given the map index, site index, and subsite index, the subsite coordinate can be found. Given the map index and the site index, a site coordinate can be found. These coordinate results are used to instruct the prober 106 where the probe pins should contact with a specified location on the wafer. The coordinate can be an absolute distance or a relative offset distance. The unit of measure can be in die indices or microns. Sets M, S, and SS are defined for Map, Site, and Subsite sets respectively. These sets are arguments for predicates, subsiteCoordinate and siteCoordinate, which provide proof for existence of subsite and site coordinates.

$\langle x, y \rangle$ (x: Z$\wedge$y:Z)$\vee$(x: R$\wedge$y:R)

subsiteIndex[1. .ss]:Z+ siteIndex[1. .s]:Z+ mapIndex [1. .m]:Z+

SubsiteCoordinate(mapIndex[m], siteIndex[s], subsiteIndex[ss]), returns $\langle x, y \rangle$ SiteCoordinate(mapIndex[m], siteIndex[s]), returns $\langle x, y \rangle$ M:set S:set SS:set subsiteCoordinate(M:set, S:set, SS:set), returns B siteCoordinate(M:set, S:set), returns B Register A register (R) is an integer type uniquely identifying each resultant Electrical Test Result (ETR) real type value, as follows:

R:Z

ETR:R

Measurement

Each time that the probe pins make contact with the wafer, electrical connections with the test structures to the parametric test system are established, and tests are performed to acquire a Electrical Test Result (ETR). To provide unique identification, a Register (R) is associated with each ETR. Each ETR is stored in memory and upon completion of each wafer being tested in the lot; the ETRs for each wafer are saved to storage and then transferred to the database 111.

A measurement is a 2-tuple pair$\langle$R, ETR$\rangle$. Rather than use primitive data types, an abstract data type, ADT, is defined to support the concept of a measurement. Given the Register, the predicate, measurement(R), is used to prove existence of a measurement, as follows:

⟨R, ETR⟩
Measurement(R):ADT, returns ETR
measurement(R), returns R

Subsite

A Subsite (SS) is a set containing one or more ordered pairs of Measurements. A Subsite (SS) is located inside a site with a relative offset. At run time, the prober subsystem will move to each subsite coordinate per the map index, site index, and subsite index. For all Measurements, such that each Measurement is an element of Subsite set, the subsite coordinate can be found given the map set, site set, and subsite set as follows:

SS:set={(Measurement$_1$), (Measurement$_2$), ... , (Measurement$_n$)}($\forall m_n$:Measurement|m$_n \in$SS:subsiteCoordinate (M, S, SS))

Test routines performing measurements at the Subsite may elect to queue a request to switch from one probing map to another probing map at the end of the Subsite testing. Fault tolerant constraints to perform dynamic map switching are performed after subsite testing in order to protect the wafer product being tested from potential damage from the electrical stimuli applied during the testing. After Subsite testing is done, all electrical stimuli are removed from the wafer, which allows for a harmless transition to another map.

Site

A Site (S) contains one or more ordered Subsite (SS) sets. All Subsite (SS) elements in the Site (S) set are referenced by one site die coordinate. At run time, the prober 106 moves to each site coordinate per the map index and site index. For all Subsites, such that each Subsite is an element of the Site set, the site coordinate may be found given the map set and site set as follows:

S:set={SS$_1$, SS$_2$, ... , SS$_p$}
($\forall SS_p$|SS$_p \in$S:siteCoordinate(M, S))

Map

A Map (M) set contains one or more ordered Site (S) sets. A Site (S) is an area on the map where the probe pins make one or more electrical contacts, which logically combine subsites into one set identical to other sites across the map, holds. For all Sites, such that each Site is an element of the Map set, a map index that identifies the Site holds as follows:

M:set={S$_1$, S$_2$, ... S$_q$}
($\forall S_i \land \forall S_j$|S$_i \in$M$\land$S$_j \in$M:S$_i \equiv$S$_j$)
($\forall S_q$|S$_q \in$M:mapIndex[m])

Measurement, Subsite, Site, Map Relationship

Describing a relationship of measurements, subsites, sites, and maps, a Measurement instance may or may not belong to two or more subsites from different maps. The same Measurement instance belongs to different subsites (sites and maps) only if the measurement associated with register R has the same subsite offset coordinates, and corresponding site coordinates on different maps are thus logically attached to the same physical location on the wafer under test, as follows:

($\exists m_n$: Measurement|m$_n \in$SS$_i \land$SS$_i \in$S$_j \land$S$_j \in$M$_k$, k$\geq$2:
subsiteCoordinate(M$_a$, S$_b$, SS$_c$)=subsiteCoordinate(M$_d$, S$_e$, SS$_f$)$\land$
siteCoordinate(M$_a$, S$_b$)=siteCoordinate(M$_d$, S$_e$))

Badsite

Each Map may have a total number of Sites, totalSites [mapindex], on the wafer to be tested. The total number of Badsites and totalBadSites [R, mapindex] indicate the number of bad measurements for a register R. Each map may keep its percentage of Badsites, percentBadSites [R, mapindex], only for Registers that have been associated with a Badsite. A register is associated with a Badsite when the parametric engineer creates the wafer test plan. For each map, the percentBadSites [mapIndex], is the total number of badsites for a map divided by the total number of sites on the map. The parametric engineer may predefine the percentBadSiteThreshold for each register when the wafer test plan is created. The percentBadSiteThreshold may be used at runtime to compare the percentBadSites against. At the start of each wafer test, the totalBadsites [mapindex] counter may be reset to zero for each map index.

totalSites[mapIndex]:Z=M.count( )
($\forall M_q$|S$_q \in$M:totalBadsites [R, mapindex])
totalBadsites [R, mapindex]:Z
percentBadSites [R, mapindex]:R
percentBadSites [R, mapIndex]=totalBadsites[R, mapIndex]/totalSites
[mapIndex]*100%
percentBadSiteThreshold:R
($\forall S_q$|S$_q \in$M:totalBadsites [mapIndex]=0)

If the percentBadSites exceeds the percentBadSiteThreshold threshold, then the system may cause a variety of output actions:

Pause the test.
Pause and notify the parametric engineer. For example, send a page and/or email.
Lockout the operator on the badsite and request the operator to enter a password to continue.
Put the lot on hold.
Enable the next map.
Switch to the next map.

For any given wafer, Map Badsite percentBadSites [mapindex] and percentBadSiteThreshold later determine a potential dynamic switch from one probing map to another probing map.

Badwafer

The total number of Badwafers, totalBadWafers [mapIndex], indicates the number of bad wafers that exist in a lot run. Each map may keep its own percentage of bad wafers, percentBadWafers [mapIndex]. For each map, the percentBadWafers [mapIndex], is the total number of badsites for a map divided by the total number of sites on the map. The parametric engineer may predefine the percentBadWaferThreshold for each Badwafer when the wafer test plan is created. The percentBadWaferThreshold may be used at runtime to compare against the percentBadWafers. The totalBadWafers must persist across all wafers in the lot.

totalBadWafers [mapIndex]: Z
percentBadWafers [mapIndex]: R
percentBadWafers[mapIndex]
=totalBadWafers[mapIndex]/totalBadWafers[mapIndex]
*100%
percentBadWaferThreshold: R If the percentBadWafers exceeds the percentBadWaferThreshold threshold, then the system may cause a variety of output actions:

Pause the test.
Pause and notify the parametric engineer. For example, send a page and/or an email.

Lockout the operator on a badwafer and request the operator to enter a password to continue.
Put lot on hold.
Enable the next map.
Switch to the next map.

Fully Tested Map

Each map can be fully tested as per the parametric engineer's definition. The predicates, tested(S), tested(SS), and tested(Measurement) evaluate to true when their argument sets Site (S), Subsite (SS), or Measurement (M) are complete.

The concept of a map being fully tested means each site on the map has been tested. (See FIG. 6 for a sample of a Fully Tested Map.) Consequently, a site may be tested when each of its subsite elements of the site set are tested. A subsite may be tested when each of its measurement elements of the subsite set have acquired all measurements.

tested(S)
tested(SS)
tested(Measurement)
(∀S|(S∈M):tested(S))
(∀SS|(SS∈S):tested(SS))
(∀Measurement (Measurement∈SS):tested(Measurement))

Partially Tested Map

Each map can be partially tested as per the parametric engineer's definition. See FIG. 6 for a sample of a Partially Tested Map. The predicates partiallyTested(M), partiallyTested(S), and partiallyTested(SS) evaluate to true when their argument sets Site (S), Subsite (SS) or Measurement (M) are incomplete.

The concept of a map being partially tested means there exists at least one site on the map not being tested. (See FIG. 6 for a sample of a Partially Tested Map.) Consequently, a site is not tested when there is at least one subsite of the site not being tested. The subsite is not tested when all Measurements of the subsite are not acquired.

partiallyTested(M)
partiallyTested(S)
partiallyTested(SS)
(∃S|(S⊆M)∧(¬tested(S)):partiallyTested(M))
(∃SS|(SS⊆S)∧(¬tested(SS)):partiallyTested(S))
(∀Measurement|(Measurement∈SS)∧(¬tested(Measurement)): partiallyTested(SS)

Prober Movement Patterns

Selecting multiple maps at lot run-time allows each map to offer a new prober movement pattern. Using the selected map, the test station 101 instructs the prober 106 to move to each site coordinate using a map-specific pattern. The prober movement patterns depicted in FIGS. 2, 3, and 4 may reduce accumulated prober-error offsets.

Figure 2:
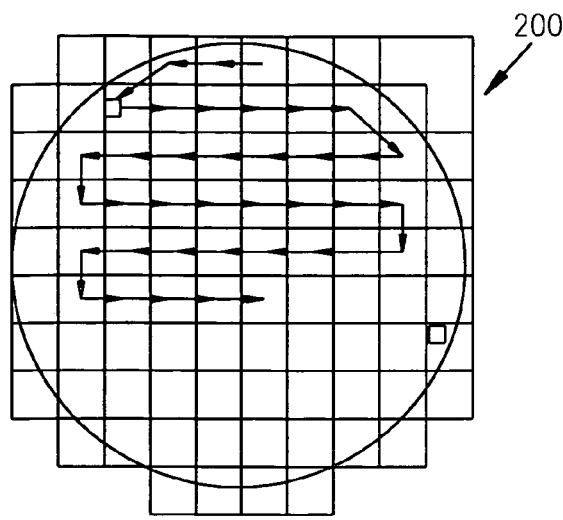
FIG. 2 depicts a pictorial representation of a serpentine-like prober-movement pattern, according to an embodiment of the invention.

FIG. 2 depicts a pictorial representation of a serpentine-like prober-movement pattern on the wafer 200. The serpentine prober-movement pattern may be the most-optimal, least-traveled distance pattern. The serpentine pattern can be thought of as a snake-like progression from site-to-site. This movement pattern may minimize the total offset error from the base coordinate.

Figure 3:
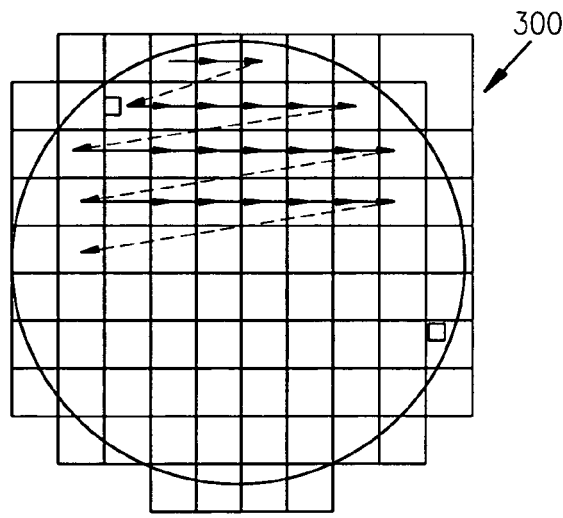
FIG. 3 depicts a pictorial representation of a row-by-row prober movement pattern, according to an embodiment of the invention.

FIG. 3 depicts a pictorial representation of a row-by-row prober movement pattern on the wafer 300. The row-by-row prober movement pattern may be the next less-optimal pattern. This sub-optimal movement pattern can be visualized as reading rows of text. It may not entirely minimize accumulated offset error from the base coordinate. However, it may provide some level of optimization.

Figure 4:
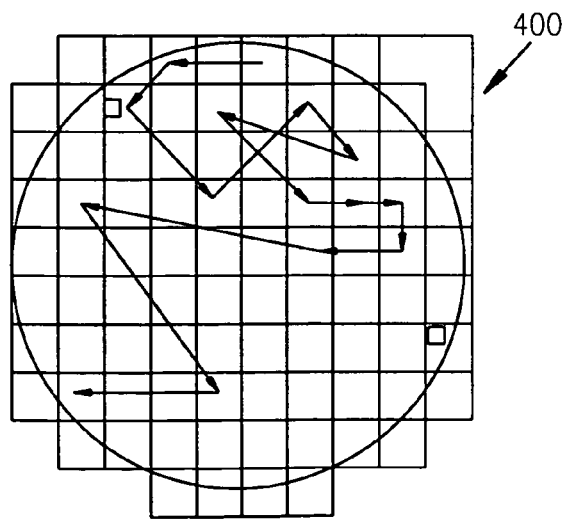
FIG. 4 depicts a pictorial representation of a user-defined prober movement pattern, according to an embodiment of the invention.

FIG. 4 depicts a pictorial representation of user-defined prober movements on the wafer 400. User-defined prober movements may be the least-optimal pattern and provide users with the capability to define custom-stepping patterns. The user-defined prober movement is not intended to minimize the total offset error from the base coordinate, but it does empower the user to move to specific Sites in a predetermined order, which allows stepping pattern definitions tailored to identify specific process-related problems. Stepping patterns can be used to identify performance characteristics unique to different processes, such as center to edge of wafer variations due to etching or depositions or photo lithography induced striping.

Multiple Wafer Map

A Multiple Wafer Map (MWM) set may contain one or more ordered Map (M) sets. Each Map (M) set may contain one or more ordered Site (S) sets. Each Site set may contain one or more ordered Subsite (SS) sets. Finally, each Subsite set may contain one or more ordered Measurements. Each measurement may be a key-value pair containing a Register (R) key and an Electrical Test Result (ETR) value.

Multiple Wafer Map: set =
$\{M_1 =$
$\quad \{ S_1 =$
$\qquad SS_1 = \{ Measurement_{11}, Measurement_{12}, \ldots, Measurement_{1n} \}$
$\qquad \ldots,$
$\qquad SS_p = \{Measurement_{p1}, Measurement_{p2}, \ldots, Measurement_{pm}\}$
$\quad \ldots,$
$\quad S_q\},$
$\ldots,$
$M_r\}$ Two types of Multiple Maps are defined: Composite and Aggregate. These types differentiate by their structure and lot run time behavior.

Composite Wafer Map

Figure 5:
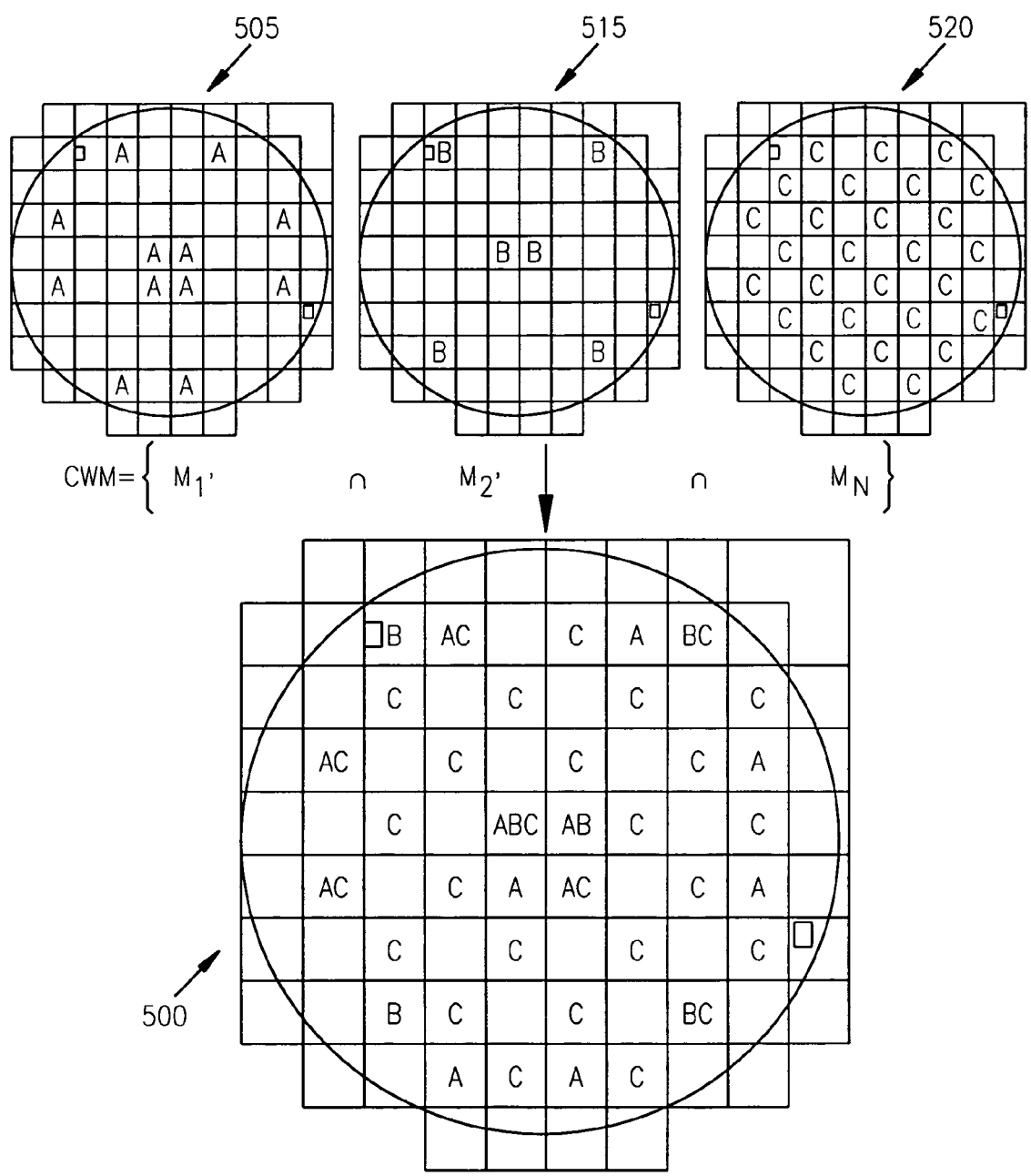
FIG. 5 depicts a pictorial representation of a Composite Wafer Map, according to an embodiment of the invention.

FIG. 5 depicts a pictorial representation of a Composite Wafer Map 500, which may be the intersection of maps 505, 515, and 520 in an embodiment of the invention. Although FIG. 5 shows the Composite Wafer Map 500 as the intersection of three maps 505, 515, and 520, in another embodiment, the Composite Wafer Map may be the intersection of any number of maps. At lot run time, each Map may be inseparable from its whole Wafer Map. A bad test site input or a bad wafer input that triggers a statistical control limit may have no effect on altering the probe stepping sequence. The run-time Composite Wafer Map (CWM) 500 defines only one contiguous probe stepping sequence in an embodiment. The Composite Wafer Map may be modeled as a whole-part relationship where each map part at run-time may be treated as an inseparable contiguous prober stepping sequence as follows:

CWM:set=$\{M_1 \cap M_2 \cap \ldots \cap M_n\}$

The locations indicated by "A" in map 505 may indicate the capture of center to edge process deviations. In map 505, a moderate amount of test time is accrued. The locations indicated by "B" in maps 515 may indicate center to edge with less resolution, e.g. under-etch and over-etch issues, such as deposition, cmp, and photo resist spin-on. The locations indicated by "C" in map 520 may indicate captured lithography errors, e.g. a reticle field striping error caused by a previous fabrication step. Map 520 has tests requiring the least amount of test time.

Map 500 represents the intersection of maps 510, 515, and 520. Notice that some sites intersect, but different kinds of electrical data are being acquired. The electrical data indicates where the problem in the fabrication process occurred and/or develops the process.

Aggregate Wafer Map

Figure 6:
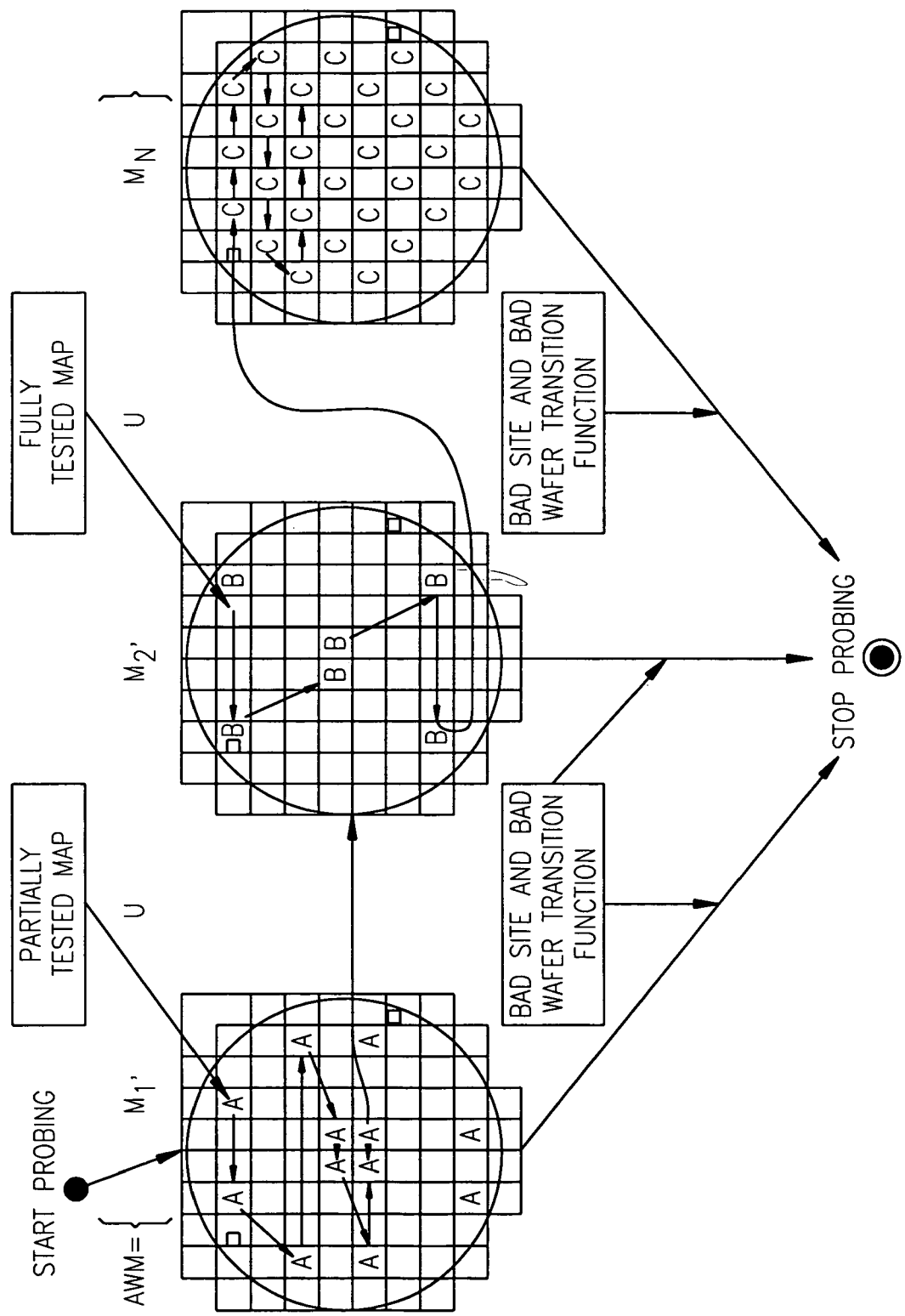
FIG. 6 depicts a pictorial representation of an Aggregate Wafer Map, according to an embodiment of the invention.

FIG. 6 depicts a pictorial representation of an Aggregate Wafer Map, according to an embodiment. At lot run time each Map may be separable from its whole Wafer Map. A bad test site input or a bad wafer input that triggers a statistical control limit can alternate the probe step sequence. An Aggregate Wafer Map (AWM) may define many non-contiguous probe stepping sequences. The Aggregate Wafer Map may be modeled as a whole-part relationship where each map part at run-time provides a different probing sequence as follows:

AWM:set={$M_1 \cup M_2 \cup \ldots \cup M_n$}

Aggregate Wafer Map Parts Dynamics

The predicate, selected ($M_n$) evaluates to true when the map, $M_n$, is selected. For example, at lot run-time, only one selected map may exist at a time, $M_{n=1}$, which may be used to command the prober subsystem 106. Likewise, for all other maps, when $M_{n \neq 1}$, these maps are not selected.

selected (Mn)
($\exists M_{n=1} | (M_n \in$ AWM:selected ($M_n$)))
($\forall M_{n \neq 1} | (M_n \in$ AWM:$\neg$selected ($M_n$)))

Non-Recursive Map Transitions Constraint

To prevent an endless loop of map execution that would cause the acquisition of redundant Electrical Test Result (ETR) data, $QM_{pv}$ may be defined to be the set of all previously visited map states, and $QM_{nv}$ may be defined as the set of all maps not yet visited.

At run-time, in an embodiment there may be nine input symbols in a set, $\Sigma$, that drives a transition function resulting in the next wafer map selected to command the prober subsystem 106. For application of these input symbols, refer to the Multiple Map Truth Table as further described below with reference to FIGS. 7A and 7B.

At edit-time, when the parametric engineer specifies the map transitions using a Test Development Tool (TDT) editor, syntax checking and error reporting may be performed on the parametric engineer's Wafer Test Plan (WTP) to ensure previously visited map loops are invalidated. The Aggregate Wafer Map transition function, $f_{AWM}$: $\delta$, enforces non-recursive map transitions.

$QM_{pv}$={$QM_x, QM_y, \ldots, QM_z$}
$QM_{nv}$={$QM_a, QM_b, \ldots, QM_c$}
i:=Partial
j:=Complete
k:=Update Bad Wafer
l:=Site Pause
m:=≧Bad Site %
n:=≧Site Retry Lockout
o:=Wafer Pause
p:=≧Bad Wafer %
r:=≧Wafer % Lockout
$\Sigma$={i k, l, m, n, o, p, r}
$f_{AWM}$:$\delta(QM_{nv}, \Sigma) \rightarrow QM_{nv+1} \notin (QM_{pv}$ FIGS. 7A and 7B depict a fragment of a Multiple Map Truth Table 700, which specifies map switching logic, according to an embodiment of the invention. The Multiple Map Truth Table 700 may include badsite inputs 702, badsite outputs and action sequence 718, badwafer inputs 720, badwafer outputs and action sequence 722, and Multiple Maps (MMAP) outputs and action sequence 724. Bad site is a Wafer Test Plan keyword denoting that a Bad Site counter is to be kept for the assigned register with the specified fields. A test may be considered bad when it is not within the limits specified in the Wafer Test Plan created by the TDT.

Badsite inputs 702 may include partial 704, complete 706, update bad wafer 708, site pause 710, bad site percentage 712, and site retry lockout 714. Badsite inputs 702 may also include an optional Lot Tracking register number.

Partial 704 may indicate that Multiple Maps with Partial completion are in effect (switch to next map prior to completion). Complete 706 may indicate that Multiple Maps are to be used and the current map will be completed prior to switching to the next map. The update bad wafer field 708 specifies whether a Bad Wafer counter will be updated if the Bad Site threshold is met. In an embodiment, values may be UPDATE or NOUPDATE, and the default may be NOUPDATE.

Site pause 710 indicates whether the test should pause or not. The default in an embodiment may be no pause. Bad site percentage 712 indicates the allowable percentage of the Threshold for Bad Sites. In an embodiment, the default may be greater than 100%. Site retry lockout 714 indicates the number of retries for a bad site exceeding the allowable threshold 712 before the executive locks the test flow and requires an engineering password to continue.

Badsite outputs and action sequence 718 may include page 726, pause 728, password lockout 730, reset badsite counter 732, increment bad wafer counter 734, and hold lot 736. Page 726 may be the first output and may occur prior to any other output. Page 726 indicates that a page notification is done per the Product Test Plan Page keyword setting. Pause 728 may be the second output and may indicate that testing is paused and a testing and display pause activity dialog is displayed. Password lockout 730 is the second output (i) and indicates that testing is to be paused and an engineering password may be required to continue. Password lockout 730 may supercede pause 728. Reset BadSite Counter 732 is the third output and resets the Bad Site counter. Increment Bad Wafer Counter 734 is the fourth output and increments the Bad Wafer counter if enabled. Hold Lot 736 indicates the end of a run and generates a hold lot condition at the end of run statistics.

Badwafer inputs 720 includes wafer pause 738, bad wafer percentage 740, and wafer percentage lockout 742. In an embodiment, the badwafer inputs 720 also includes an optional Lot Tracking register number. Wafer pause 738 is a Wafer Test Plan Keyword that specifies that a bad wafer counter is to be kept for the assigned register with the specified fields. A badsite keyword must be specified for each badwafer statistic. A test may be considered bad when it is not within the limits specified in the Wafer Test Plan created by the TDT. Wafer pause 738 specifies whether the executive should pause if the maximum percentage threshold of Bad Wafers per lot is met (PAUSE or NOPAUSE). In an embodiment, the default may be NOPAUSE. A test wafer may be considered bad when any test site is bad for a given register. Bad wafer percentage 740 specifies the Bad Wafer percentage threshold. In an embodiment, the default is >100%. Wafer percentage lockout 742 specifies the Bad Wafer threshold that will prompt the executive to lock the test flow. In an embodiment, the default is >100%.

Badwafer outputs and action sequence 722 includes reset badwafer counter 744, pause 746, password lockout 748, page 750, and hold lot 752. Reset Bad Wafer Counter 744 may be the first output and may reset the bad wafer counter. Pause 746 may be the second output and may pause testing and display the pause activity dialog. Password lockout 748 may be the Second Output (i) and may pause testing and require an engineering password to continue. The password lockout 748 may supercede the pause 746. The Page 750 may be the third output and may cause a Page notification per the Product Test Plan Page keyword setting. The hold lot 752 may indicate an end of run and may generate a Hold Lot condition at the end of run statistics.

MMAP outputs and action sequence 724 may include next map enabled 754 and switch to next map 736. Next map enabled 754 may indicate that the next map is to be enabled after the start of the current map if Complete 706 is selected. Switch to Next Map 756 may indicate a switch should be done to the next multi-map after current map completion if complete 706 is selected, but the switch will occur prior to completing the current map if partial 704 is selected.

In an embodiment the following constraints may apply. If Pause and Password Lockout are both true for a given register, then only the password lockout needs to be performed. Password lockout=>Password entry may be required to continue the test; otherwise, the wafer/run may be aborted per an operator selection and data and run info may be saved.

BadSite Definitions: Badsite %=(# of Badsites)/(# of total sites for register of interest for that map)*100%. Site Retry Lockout=# of times SitePause has occurred−(Counter>=Compare value triggers lockout event.) Update Bad Wafer is an implicit input: if the BadWafer Key is used, then Update Bad Wafer=TRUE; otherwise Update Bad Wafer=FALSE.

BadWafer Definitions: BadWafer %=(# of Bad Wafers)/(# of Wafers Tested+# of Wafers to be tested)*100%. WaferLockout %=BadWafer %−(For calculation.) Sampling requires predetermination of the actual wafer count. If a wafer is skipped due to prober error, then it isn't included in calculations. If Switch to next Map is true, then the Bad Wafer counter is reset.

Multiple Map Definitions/Constraints: Composite & Aggregate Maps are mutually exclusive during their lifetime. But, in discrete time, either can transcend to the other. Aggregated maps may be considered to be one map with regards to the Badsite Truth Table.

The following figures are expressed using the notation defined by the Unified Modeling Language (UML).

Figure 8:
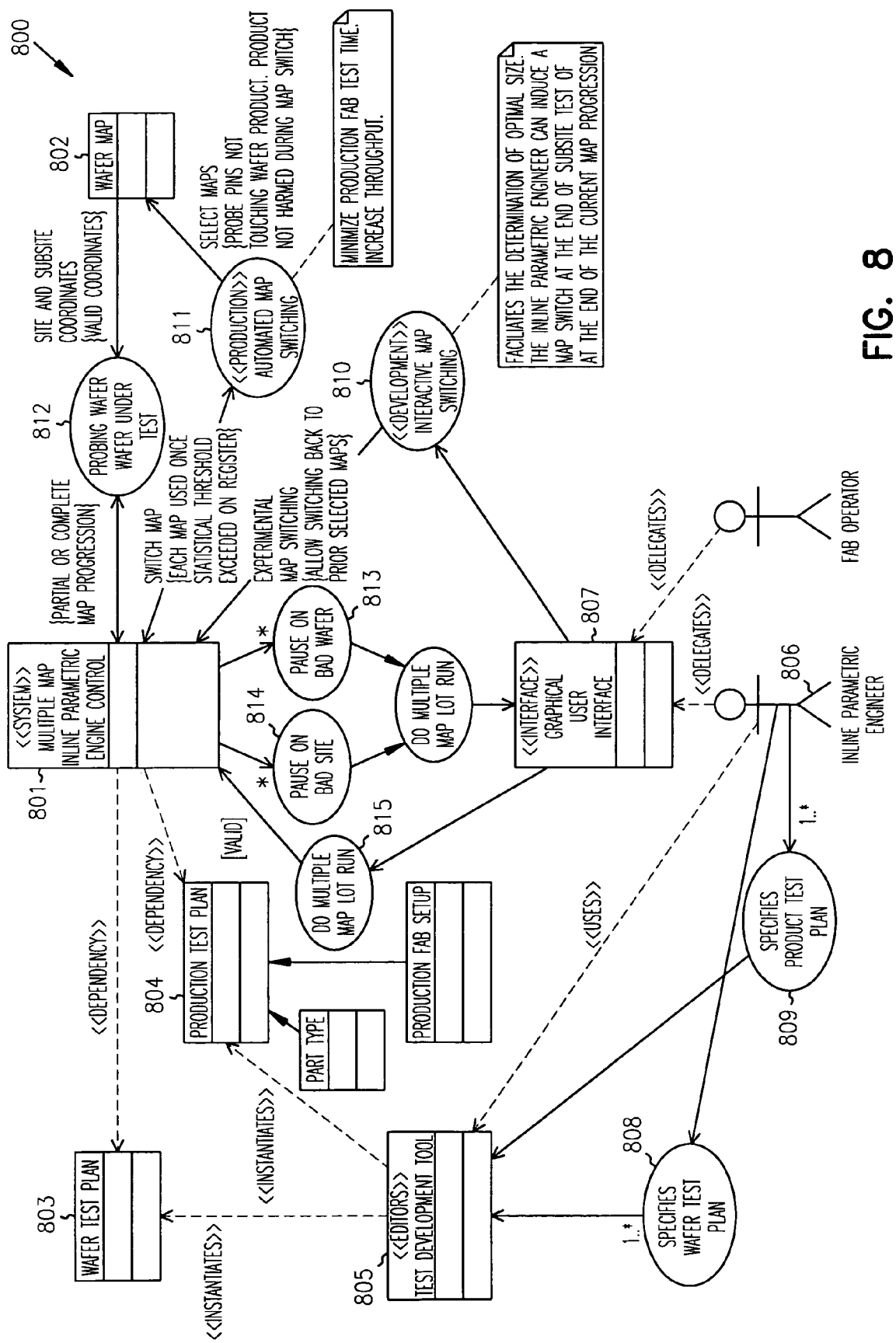
FIG. 8 depicts a use case diagram of a context for Parametric Inline Engine Control, according to an embodiment of the invention.

FIG. 8 depicts a use case diagram 800 of a context for Parametric Inline Engine Control, according to an embodiment of the invention. Case diagram 800 includes Multiple Map Inline Parametric Engine Control 801, Wafer Map 802, Wafer Test Plan 803, Production Test Plan 804, Test Development Tool 805, Inline Parametric Engineer 806, Graphical User Interface 807, Specifies Wafer Test Plan 808, Specifies Product Test Plan 809, Interactive Map Switching 810, Automated Map Switching 811, Probing Wafer Under Test 812, Pause on Bad Wafer 813, Pause on Bad Site 814, and Do Multiple Map Lot Run 815.

Figure 9:
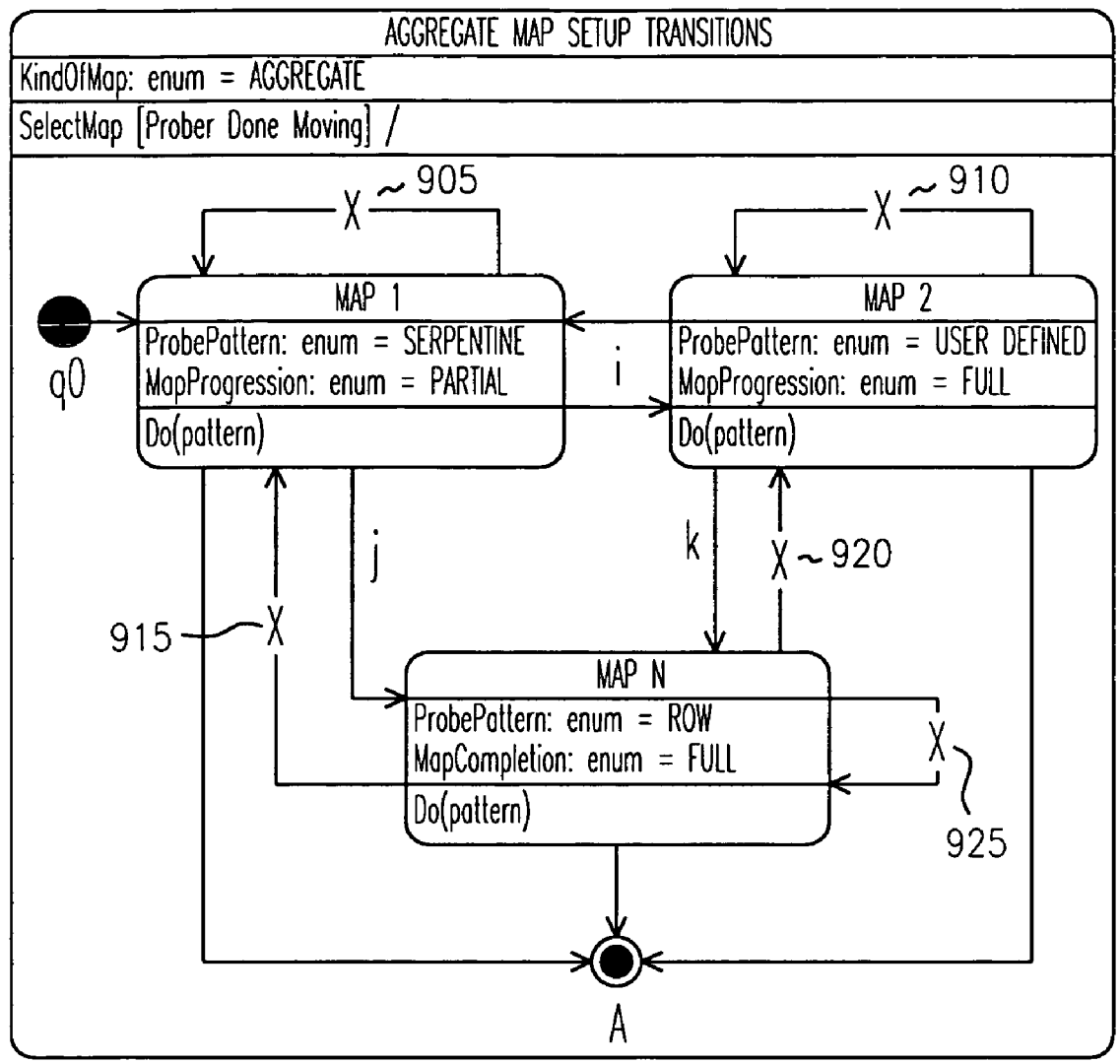
FIG. 9 depicts a composite state diagram of prohibited state transitions, according to an embodiment of the invention.

FIG. 9 depicts a block diagram of prohibited state transitions, X 905, 910, 915, 920, and 925, according to an embodiment of the invention. A state transition back to the previously executed state is prohibited and a state transition that loops back to itself is prohibited. These constraints prevent potential endless loops.

In an embodiment, the design of the system 100 may adhere to the following fault tolerant constraints:

1. Concurrent Composite States ($Q_{ccs}$) may belong to Composite States ($Q_{cs}$), but $Q_{cs}$ should not belong to $Q_{cs}$.

Constraint$_{FT1}$:={$Q_{ccs}$}∈{$Q_{CS}$}, but {$Q_{CS}$}∉{$Q_{ccs}$}

2. Any parallel forking qPF(2,m) should result in a Composite State belonging to $A_{cs}$ set each residing in their own concurrent region.

Constraint$_{FT2}$:=$f_1$:δ(qFP(2, m), Σt f)→$A_{CS}$

3. For each $Q_{ccs}$, its synchronous transition set {ΣSynch$_1$} and its asynchronous transition set {ΣAsynch$_2$} should be mutually exclusive.

Constraint$_{FT3}$:=(ΣSynch$_1$⊆Σ)∧(ΣAsynch$_2$⊆ΣE)→ ({ΣSynch$_1$}XOR ΣAsynch$_2$})

Figure 10A:
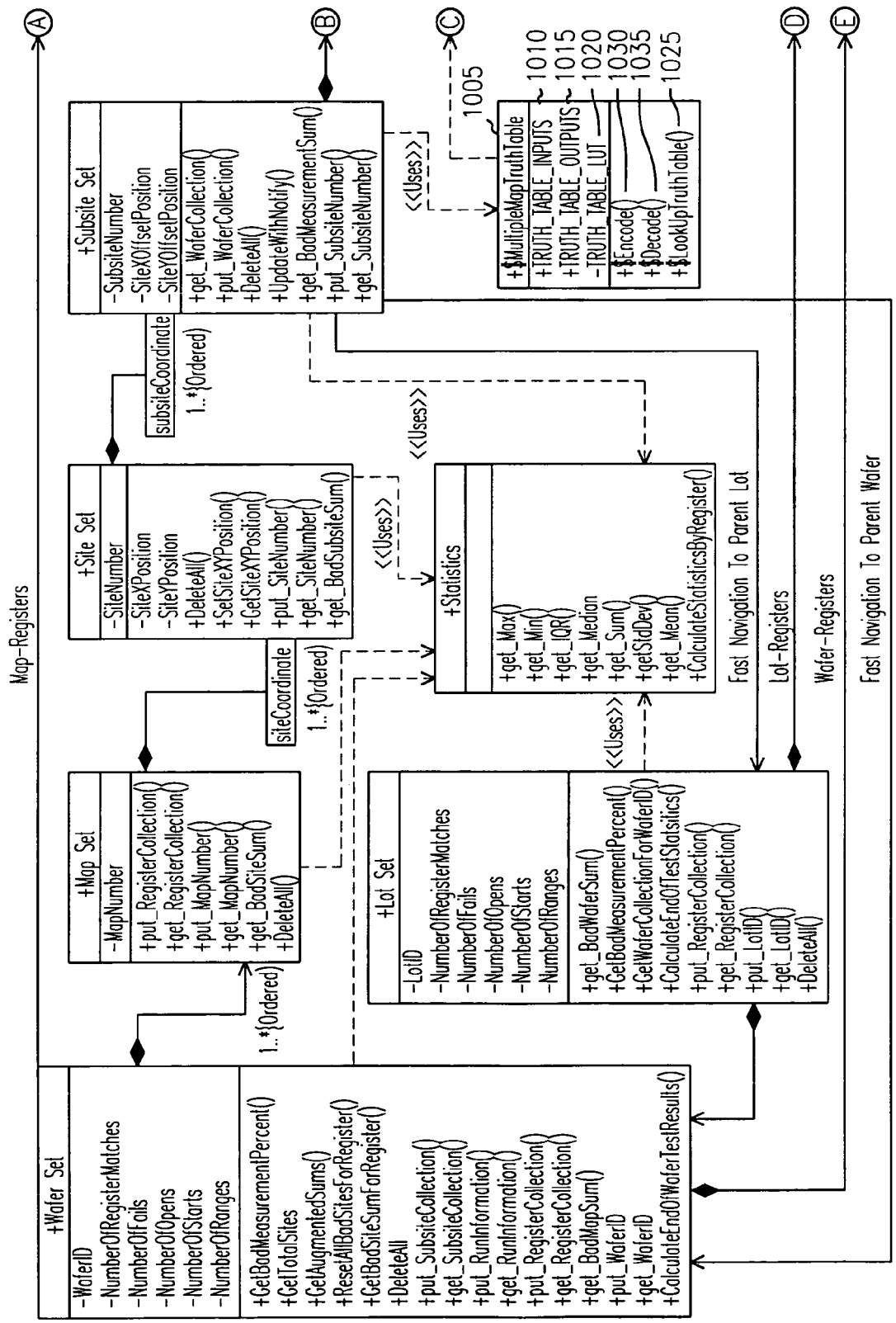
FIGS. 10A and 10B depict a class diagram for a static model reflecting the relationships of lot-wafer-map-site-subsite-measurements in addition to special classes handling Bad Sites and Register definitions, according to an embodiment of the invention.
Figure 10B:
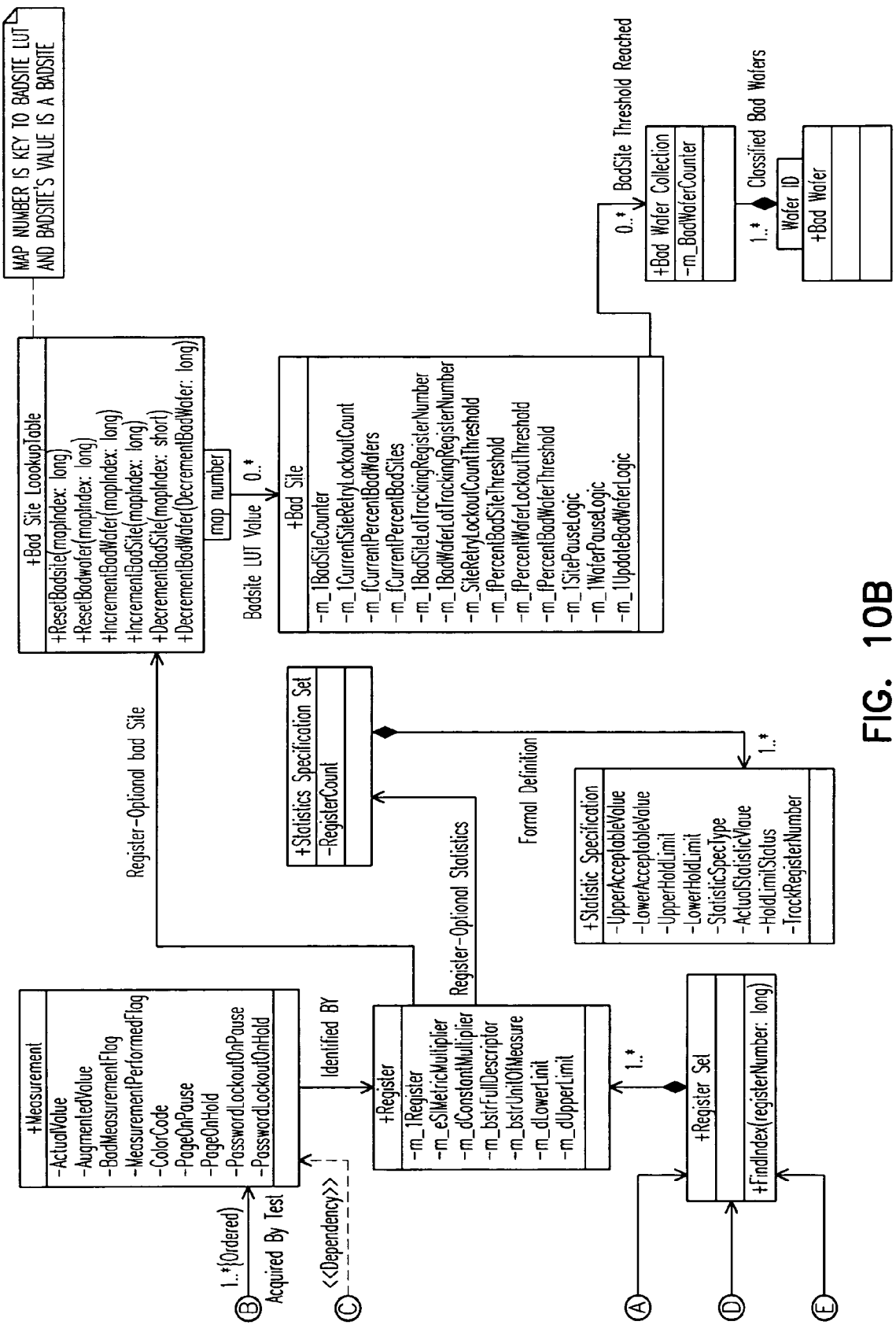

FIGS. 10A and 10B depict a class diagram for a static model reflecting the hierarchy of lot-wafer-map-site-subsite-measurements in addition to special classes handling Bad Sites and Register definitions. At the Lot Setup and Wafer Setup states, the Lot and Wafer Multiple Map Measurement Collections are created.

The MultipleMapTruthTable 1005 is a mechanism for realization of run-time map switching and implements the Multiple Map Truth Table previously described above with reference to FIGS. 7A and 7B. Each time a new Measurement is acquired, the MultipleMapTruthTable singleton evaluates the Measurement's attributes. In an embodiment, static memory class storage ensures fast decoding of the nine inputs 1010 to the thirteen outputs 1015. In an embodiment, there are $2^9$ possible input combinations, however, not all combinations are possible or applicable to the problem domain, but may be expanded. The MultipleMapTruthTable 1005 may also be expanded to use different logics of functions that transform inputs into possible output actions. Each of the Measurement's BadSite attributes may be encoded into code that drives a Look Up Table (LUT) 1020. The LUT 1020 generates a code that in turn is decoded. This decoded output code drives the behavior and future transitions of the systems; for example, the Next Map Enabled 754 and Switch To Next Map 756 actions in FIG. 7B cause the system 100 to transition to the next test map.

The class member function, MultipleMapTruthTable::LookUpTruthTable 1025 takes an input code which is returned from Truth_Table_Encode 1030 as a parameter. This method returns the binary coded representation of the outputs as described in the truth table. If the condition does not exist, a binary 0 may be returned in an embodiment, which correlates to all output actions as being false. The class member function, MultipleMapTruthTable::Decode 1035 takes an output code which represents the output condition. TRUTH_TABLE_OUTPUTS 1015 is the return type from this method. The class member function, MultipleMapTruthTable::Encode 1030 takes a TRUTH_TABLE-INPUTS 1010 as a parameter and converts it to an encoded binary representation of the input values.

Figure 11:
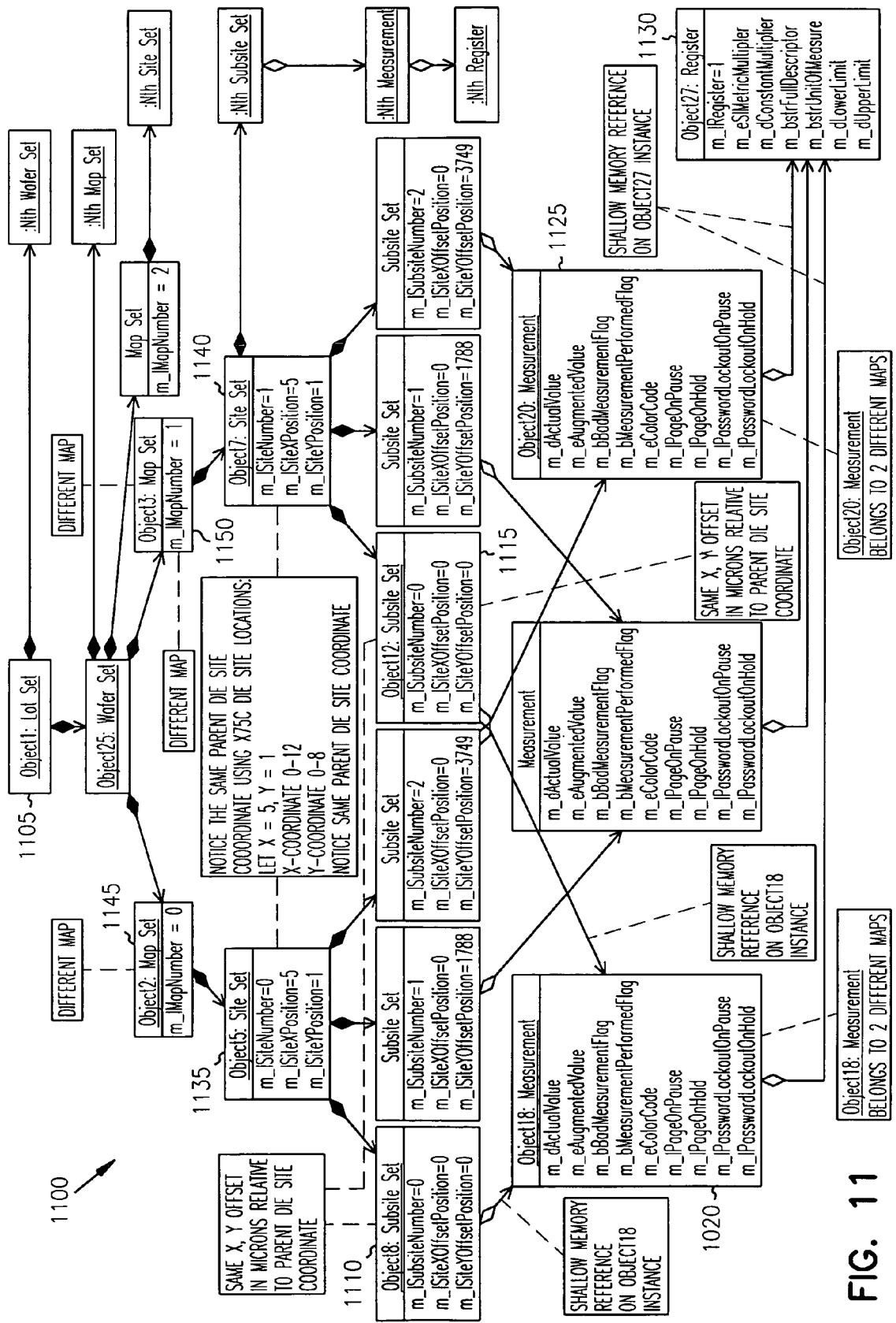
FIG. 11 depicts a object diagram of instantiations of measurement and register sets, according to an embodiment of the invention.

FIG. 11 illustrates an object diagram of instantiations of the measurement and register sets. Multiple Map Sets Object Model 1100 shows how the LotSet 1105 may be created prior to starting a lot run. During the instantiation of the measurement objects, the same measurement object may belong to different maps. It is possible only if the same measurement and the same test location belongs to the maps. Object8:SubsiteSet 1110 and Object12:SubsiteSet 1115 both share the same reference to Object18:Measurement 1120. Likewise, Object18:Measurement 1120 and Object20:Measurement 1125 both share the same reference to Object27:Register 1130. Object8:SubsiteSet 1110 and Object12:SubsiteSet 1115 both share the same X, Y offset distance in microns relative to their parent die site coordinate contained in Object5:SiteSet 1135 and Object7:SiteSet 1140, respectively. These object relationships save system memory, as well as test time or encourage more thorough testing. Consider the following scenarios:

Scenario 1: Measurement (Object 18: Measurement 1120) is performed on Map 1 (Object 2: Map Set 1145). Later in the probing progression, on Map2 (Object 3: Map Set 1150) the parametric test engineer chooses not to do the same measurement since it was already performed, which saves test time.

Scenario 2: The same as Scenario 1, but the parametric test engineer chooses to re-measure using same electrical test procedure or perform the measurement using more rigorous testing procedure. This serves the purpose of more thorough testing.

Figure 12:
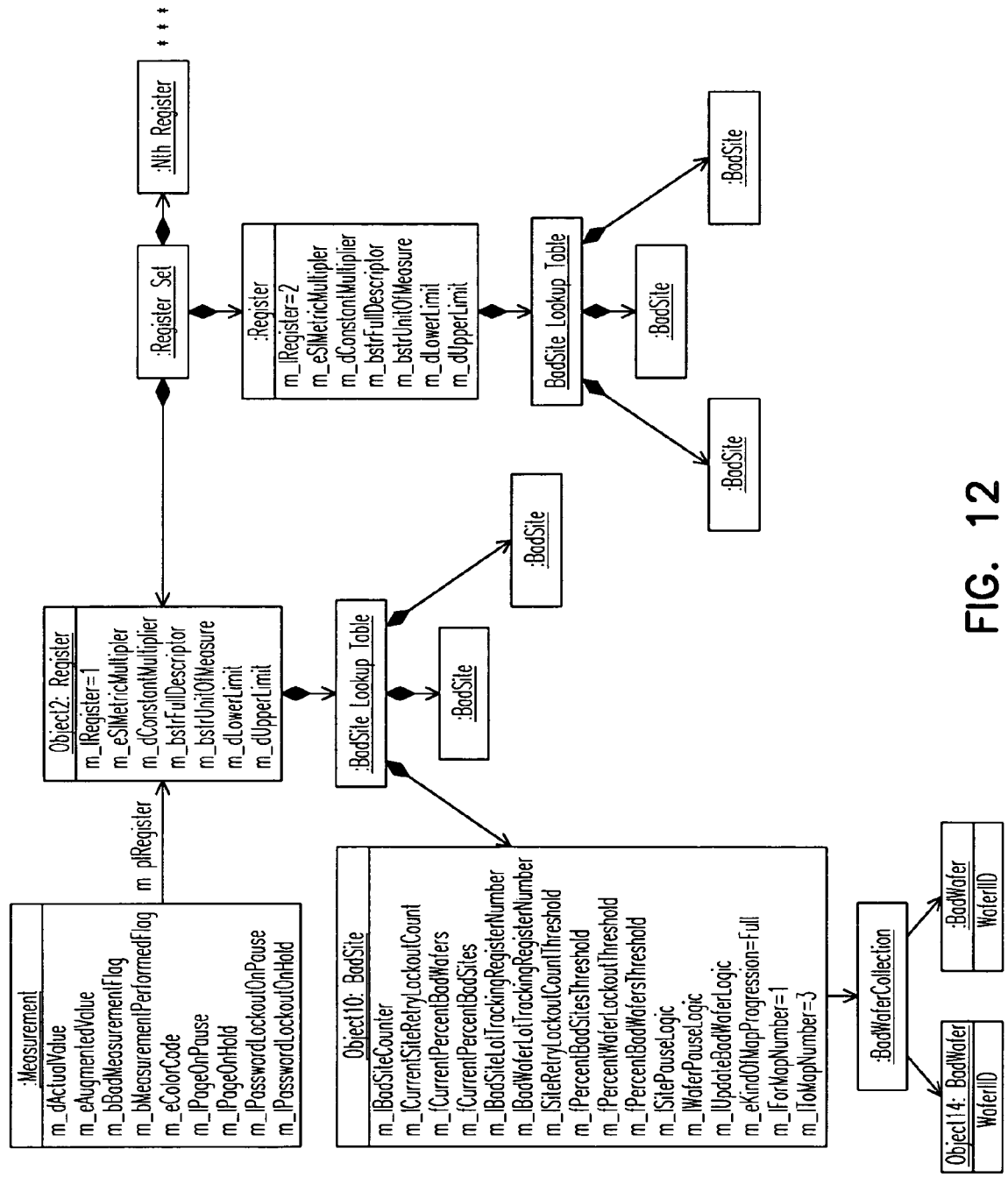
FIG. 12 depicts an object diagram of instantiations of Register Sets and Badsites and BadWafers sets associated with Registers, according to an embodiment of the invention.

FIG. 12 depicts an object diagram of instantiations of Register Sets and BadSites and BadWafer Sets associated with Registers, which specifies how the RegisterSet is to be created prior to starting a lot run.

Engineers 806 specify test strategies or maps, maps' probing patterns, maps' Full/Partial completion, and transitional sequences between the maps using their problem domain knowledge and expressing formal grammar using the language of the Wafer Test Plan 803 and the Product Test Plan 804.

Figure 13:
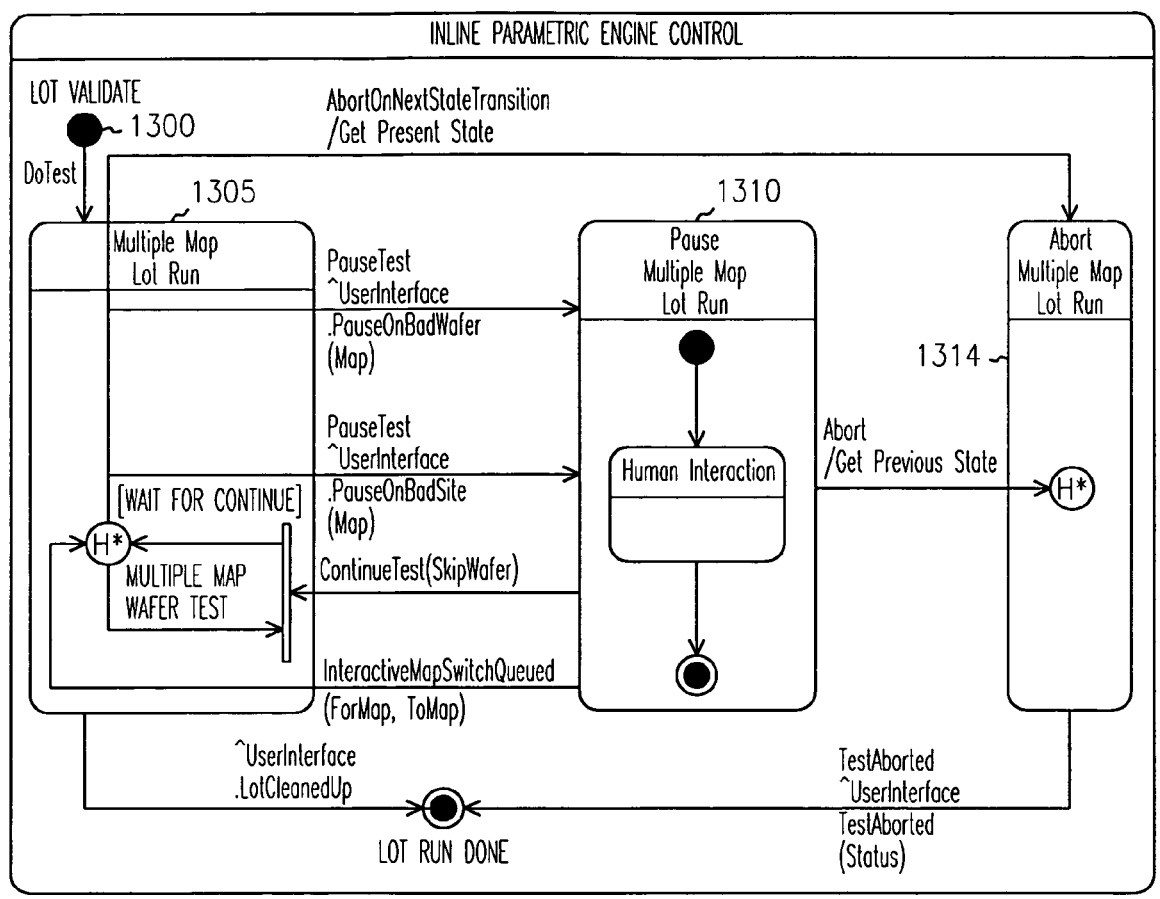
FIG. 13 depicts a composite state diagram for an Inline Parametric Engine Control, according to an embodiment of the invention.

The specified Wafer Test Plan is checked for correct syntax and loaded by the test station 101 to perform a lot run, as depicted in the Composite State diagram of FIG. 13. The Test Station 101 uses Multiple Map Inline Parametric Engine Control 801 to perform the control functions. FIG. 13 represents the dynamics of the control execution. At state 1300, the lot run is started. At state 1305, the multiple map lot run functions are performed. At state 1310, the pause multiple map lot run is performed. At state 1314, the abort multiple map lot run is performed.

Figure 14:
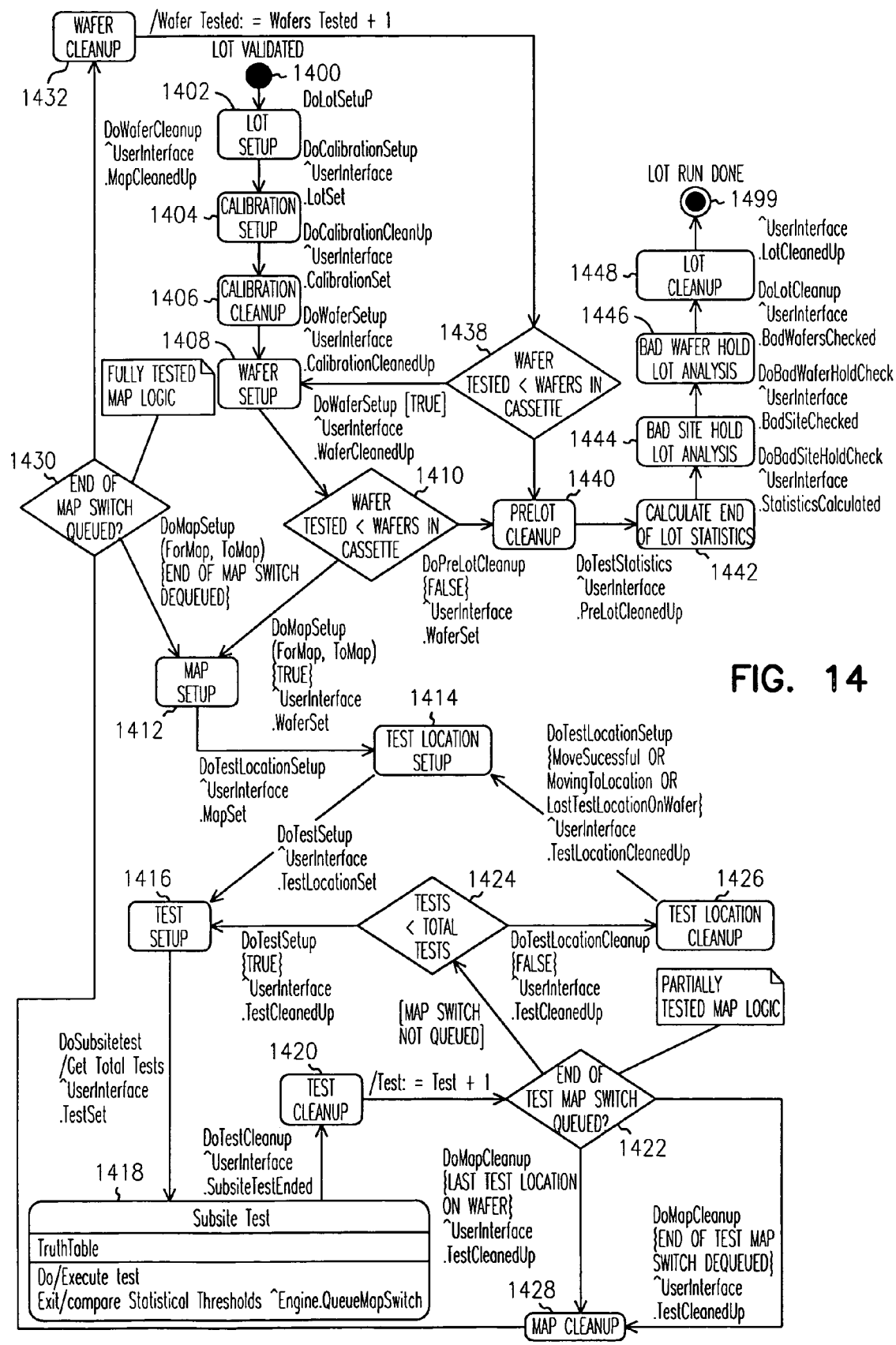
FIG. 14 depicts an activity diagram for a Flat Lot Run Activity Diagram supporting multiple maps, according to an embodiment of the invention.

Through the lifetime of the lot under test the system 100 transitions through a series of states expressed in FIG. 14. The Flat Lot Run Activity diagram in FIG. 14 shows the states, state transition, and logic that the test station 101 executes. The test station 101 may execute Multiple Maps via the state Map Setup, state Map Cleanup, and additional logic.

Control begins at state 1400. Control then continues to state 1402 where the test station 101 performs Lot Setup by reading run and wafer test plans specified by the user, preparing Prober and Instrumentation sub-systems asynchronously for the run (for example, a run-specific Prober configuration file is read, and the Prober is prepared for the test), clearing old data collections, and creating new high-level run data collections. The integrated prober 102 also loads the first wafer.

Control then continues to state 1404 where the test station 101 performs calibration setup by executing an Instrumentation Sub-system Calibration routine and performing corresponding data collection.

Control then continues to state 1406 where the test station 101 performs calibration cleanup by performing Instrumentation Sub-system Calibration and saving data for future use.

Control then continues to state 1408 where the test station 101 performs wafer setup by performing wafer test preparations asynchronously. Wafer test preparations may include loading the wafer on the test chuck, reading the wafer identifier, aligning the wafer, heating the chuck to the desired temperature, verifying wafer geometrical parameters, and moving the wafer on the test chuck to make contact with test pins at the first test location. But, any suitable wafer test preparations may be performed. The test station 101 may further create wafer data collections and prepare them for future use. The test station 101 also commands the prober 106 to position the wafer's first test location to the test pins and verify the wafer identifier using the OCR system 105.

Control then continues to decision point 1410 where the test station 101 determines whether the wafer count is less than the total number of wafers. If the determination at decision point 1410 is true, then control continues to state 1412 where the test station 101 performs map setup by commanding the prober to use the wafer map number, which causes the prober to move to the first test location on the new wafer map. Control then continues to state 1414 where the integrated prober 102 prepares for tests at the specified test locations.

Control then continues to state 1416 where the actual test specified in the map is loaded into memory and corresponding data collection is linked to the test. The Instrumentation sub-system is prepared for the test.

Control then continues to state 1418 where subsite test is performed. Control then continues to state 1420 where test cleanup is perform by unloading the test from memory and putting the instrumentation sub-system into a neutral state.

Control then continues to state 1422 where the test station 101 determines whether the end of test map switch is queued. If the map switch is not queued, then control continues to decision point 1424 where the test station 101 determines whether the number of tests is less than the total number of tests. If the determination at decision point 1424 is true, then control continues to state 1416, as previously described above. If the determination at decision point 1424 is false, then control continues to state 1426 where test location cleanup is performed. Control then returns to state 1414, as previously described above.

If the determination at decision point 1422 indicates that the end of test map switch is dequeued or the last test location on the map is reached, then control continues to state 1428 where map cleanup is performed. Control then continues to decision point 1430 where the test station 101 determines whether the end of map switch is queued. If the end of map switch is dequeued, then control returns to state 1412, as previously described above.

If the end of map switch is queued, then control continues from state 1430 to state 1432 where wafer cleanup is performed. Control then continues to decision point 1438 where the test station 101 determines whether the wafer count is less than the total number of wafers. If the determination at decision point 1438 is true, then control continues to state 1408, as previously described above.

If the determination at decision point 1438 is false, then control continues to state 1440 where the test station 101 performs pre-lot cleanup by collecting data for further analyses. Control then continues to state 1442 where the test station 101 calculates the end of lot statistics on the data collections across the wafers and lots. Control then continues to state 1444 where the test station 101 performs bad site hold lot analysis based on collected site data according to the specified wafer test plan. Control then continues to state 1446 where the test station 101 performs bad wafer hold lot analysis based on collected wafer data according to the specified wafer test plan. Control then continues to state 1448 where the test station 101 commands the integrated prober 102 and the instrumentation sub-system into a neutral states. The test station 101 also reports overall test results to a user and saves overall run data. Control then continues to state 1499 where the lot run is done.

If the determination at decision point 1410 is false, then control continues to state 1440, as previously described above.

Figure 15A:
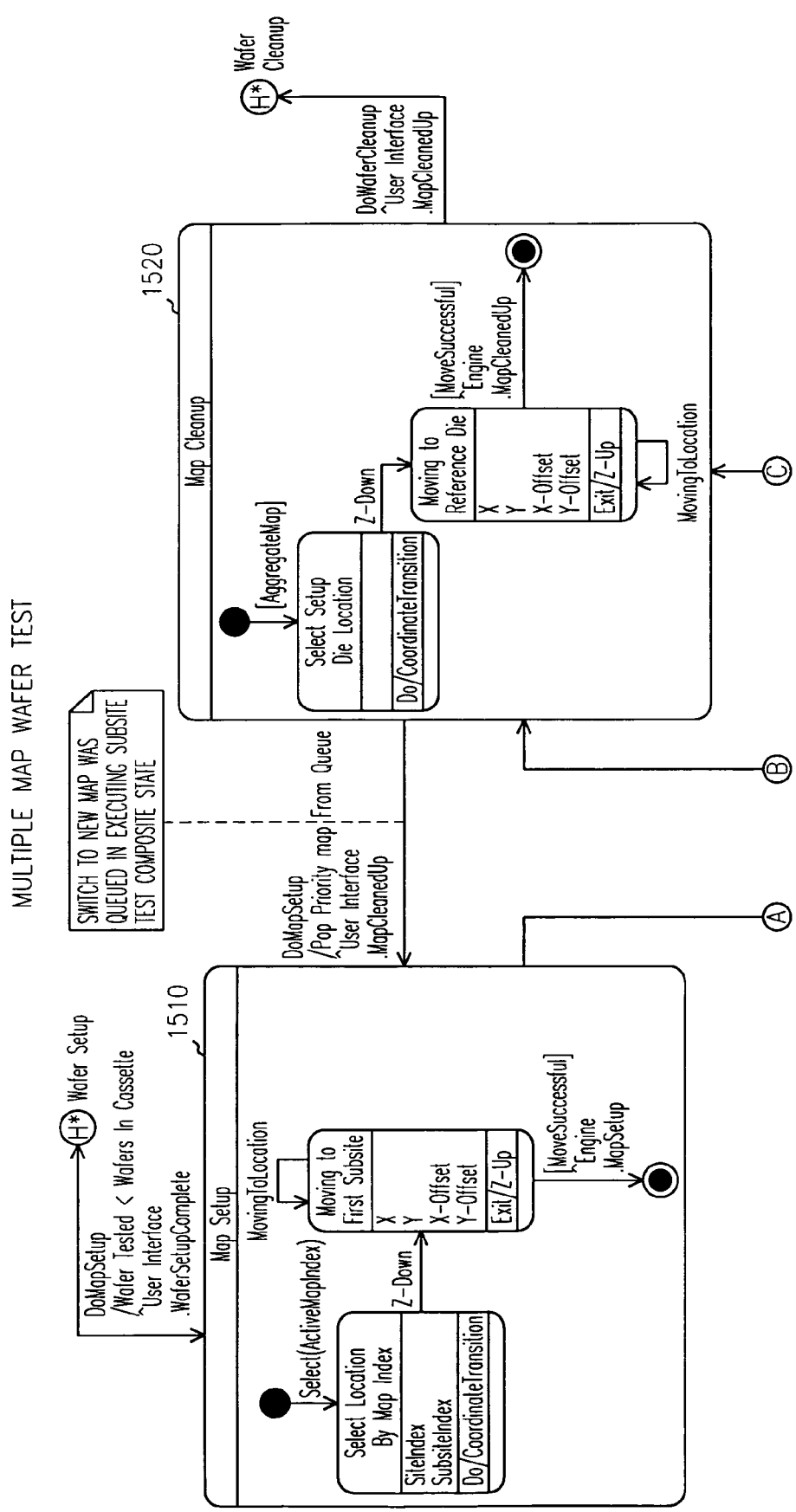
FIGS. 15A, 15B, 15C, 15D, 15E, and 15F depict a state diagram of a detailed dynamic view of an Engine's States from Historical WaferSetup to Historical WaferCleanup, according to an embodiment of the invention.
Figure 15B:
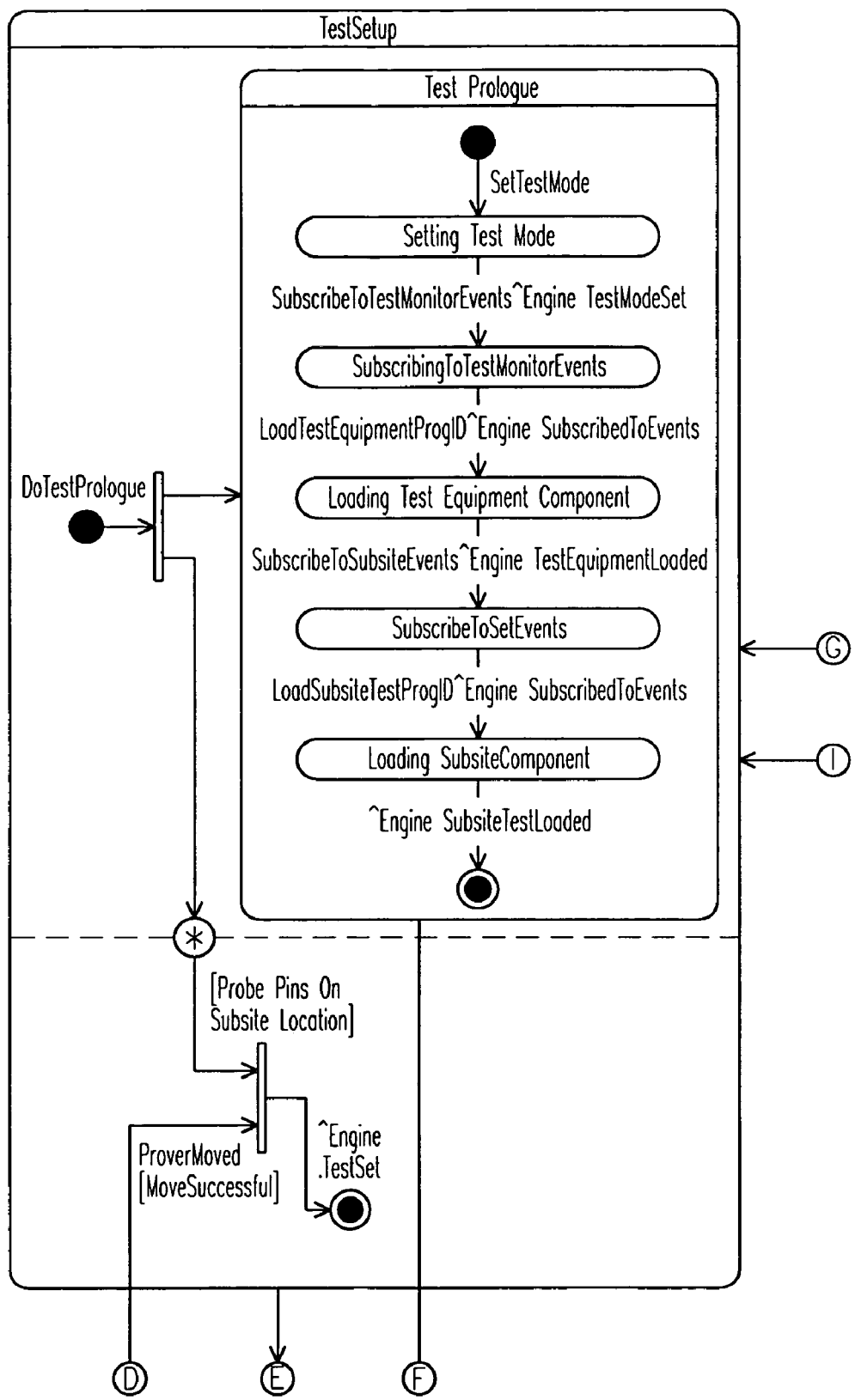
Figure 15C:
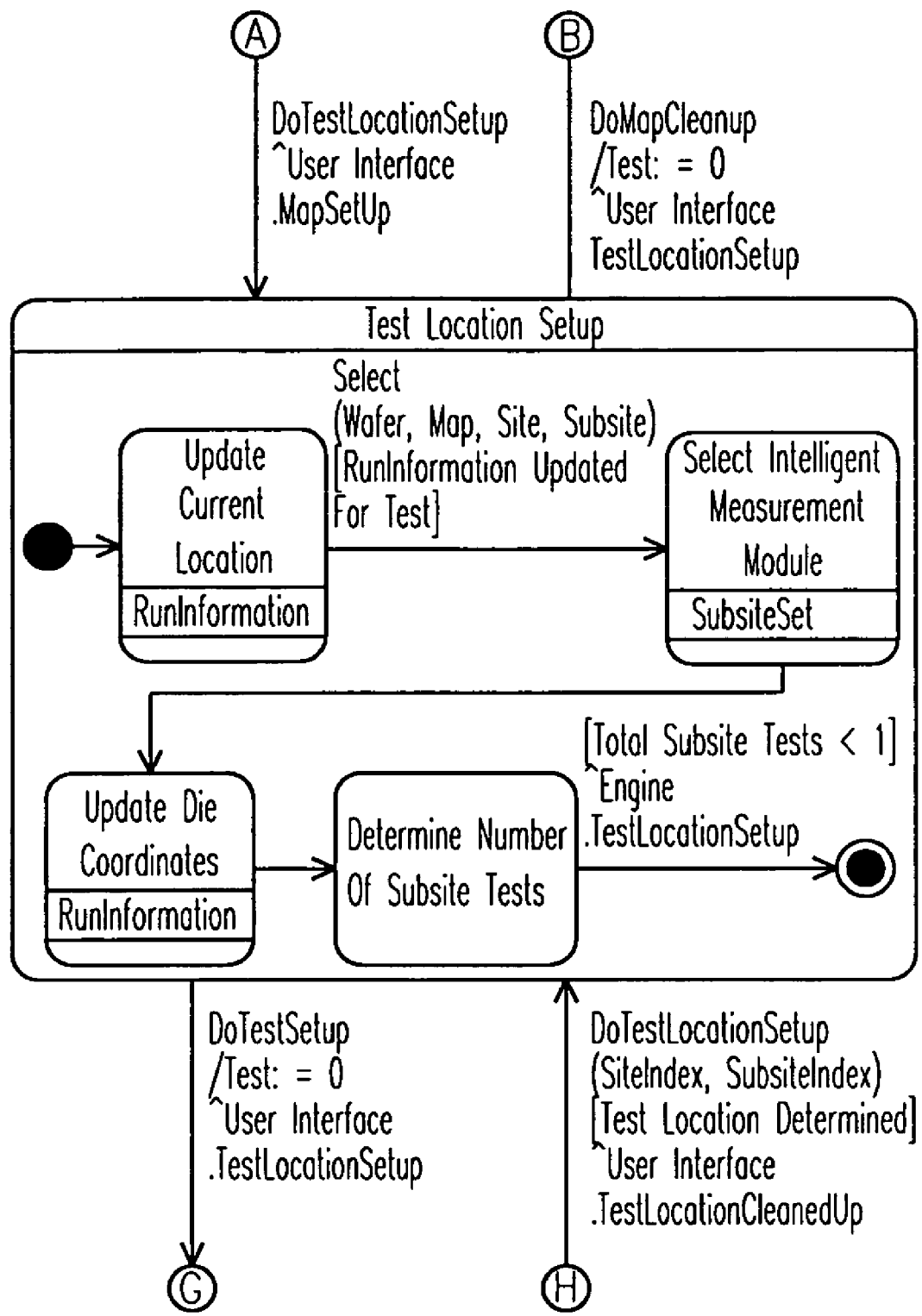
Figure 15D:
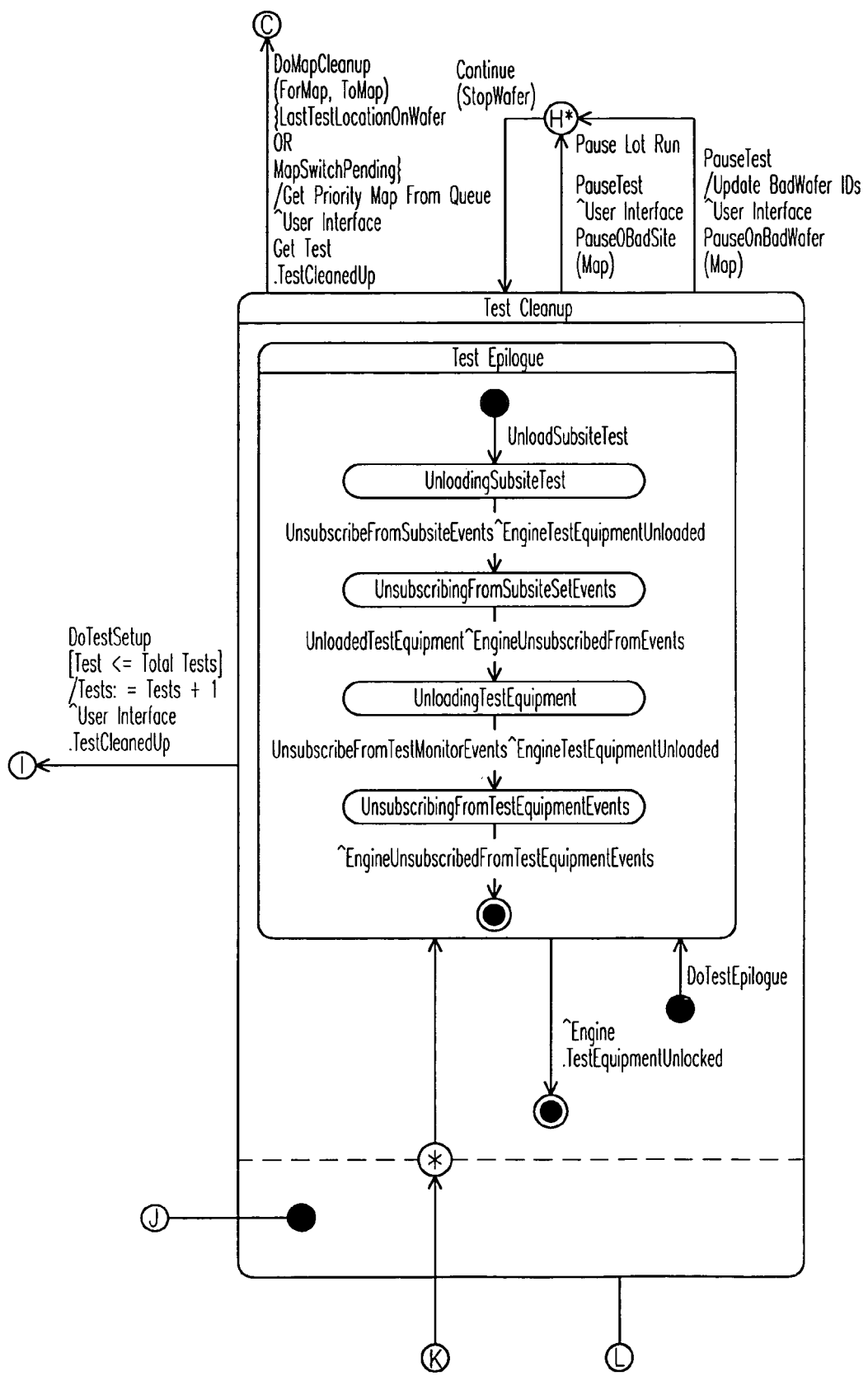
Figure 15E:
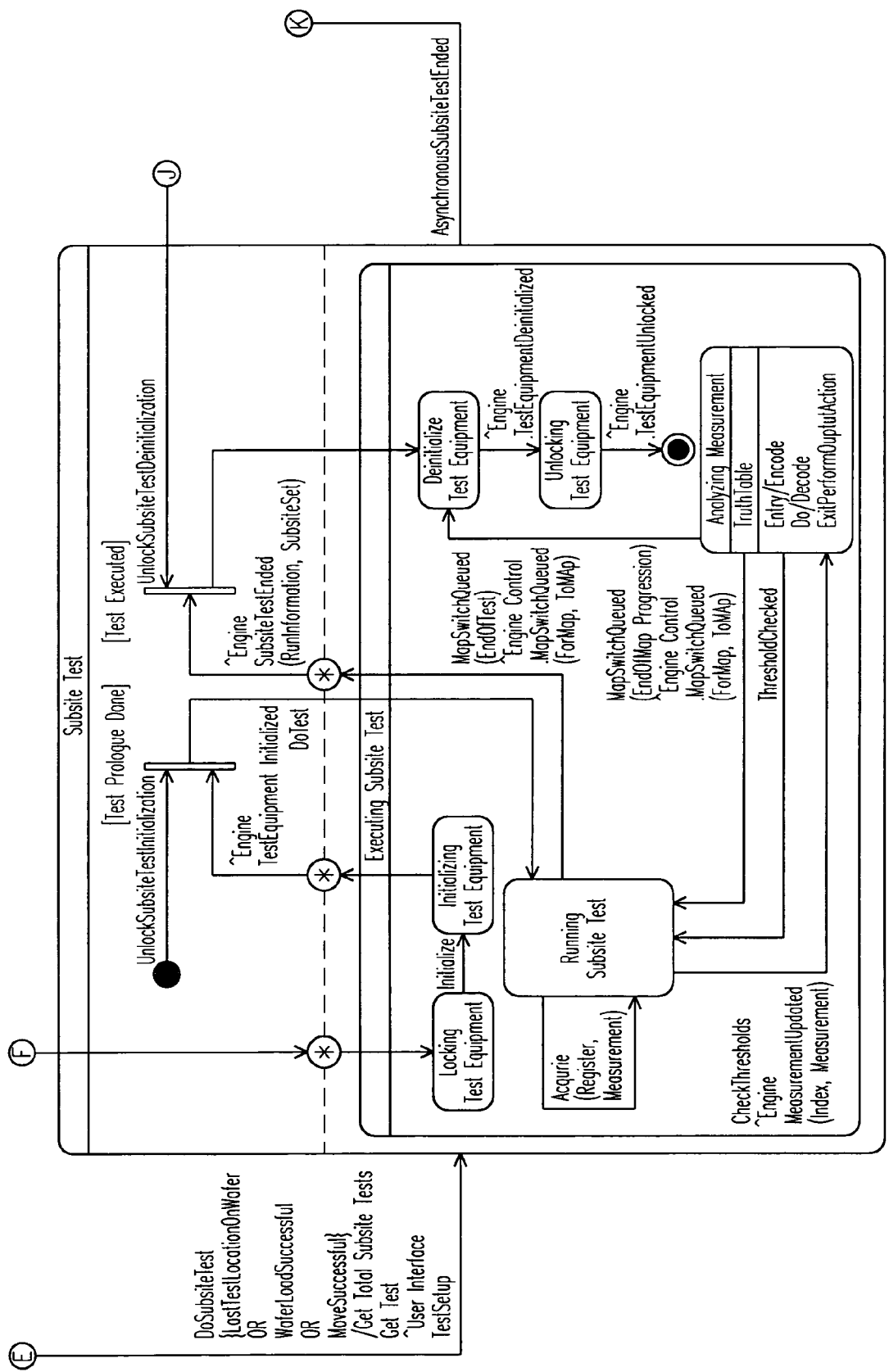
Figure 15F:
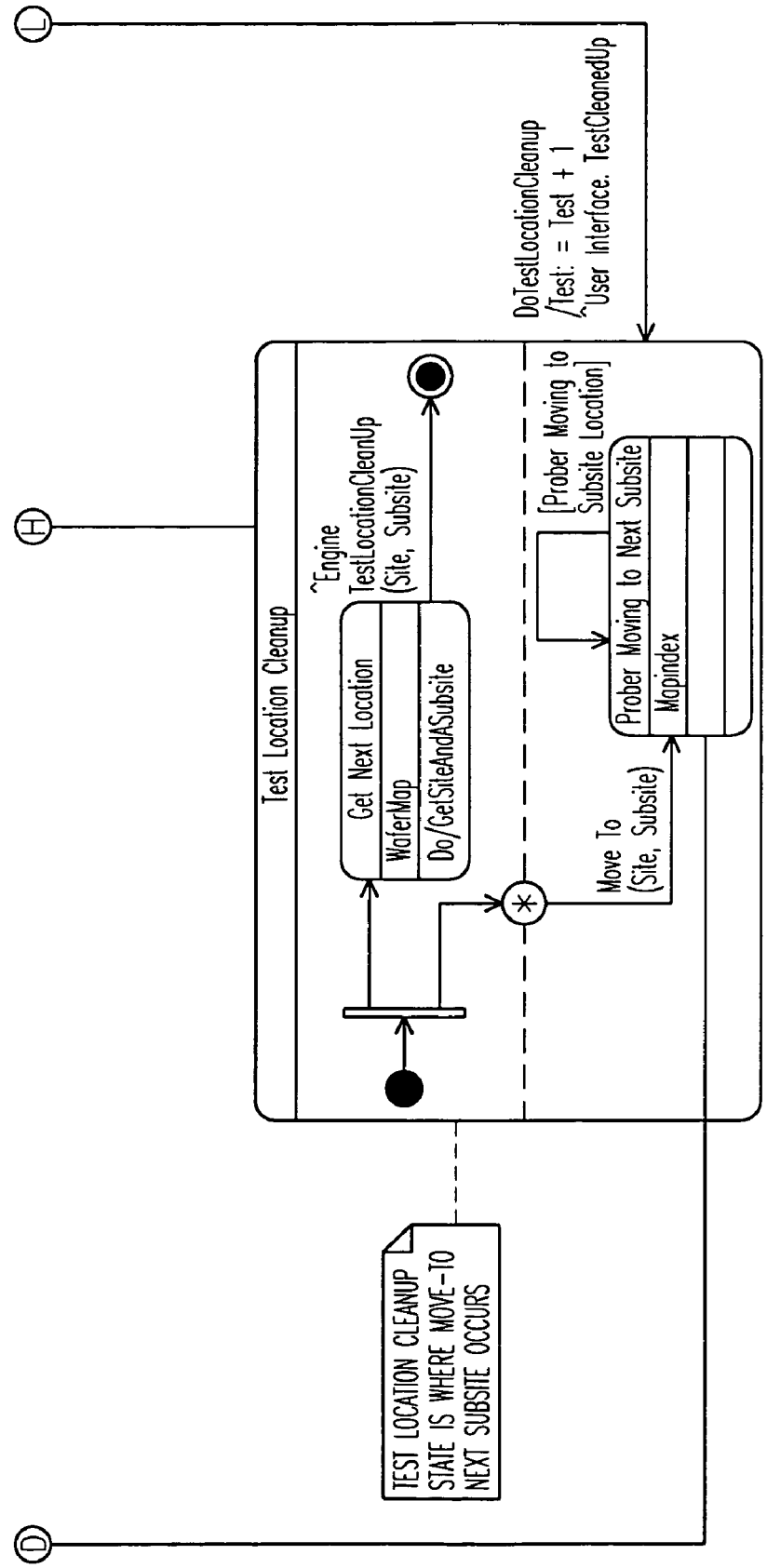

FIGS. 15A, 15B, 15C, 15D, 15E, and 15F depict a state diagram of a detailed dynamic view of an Engine's States from Historical WaferSetup to Historical WaferCleanup, according to an embodiment of the invention. FIG. 15A includes states Map Setup 1510 and Map Cleanup 1520.

Figure 16:
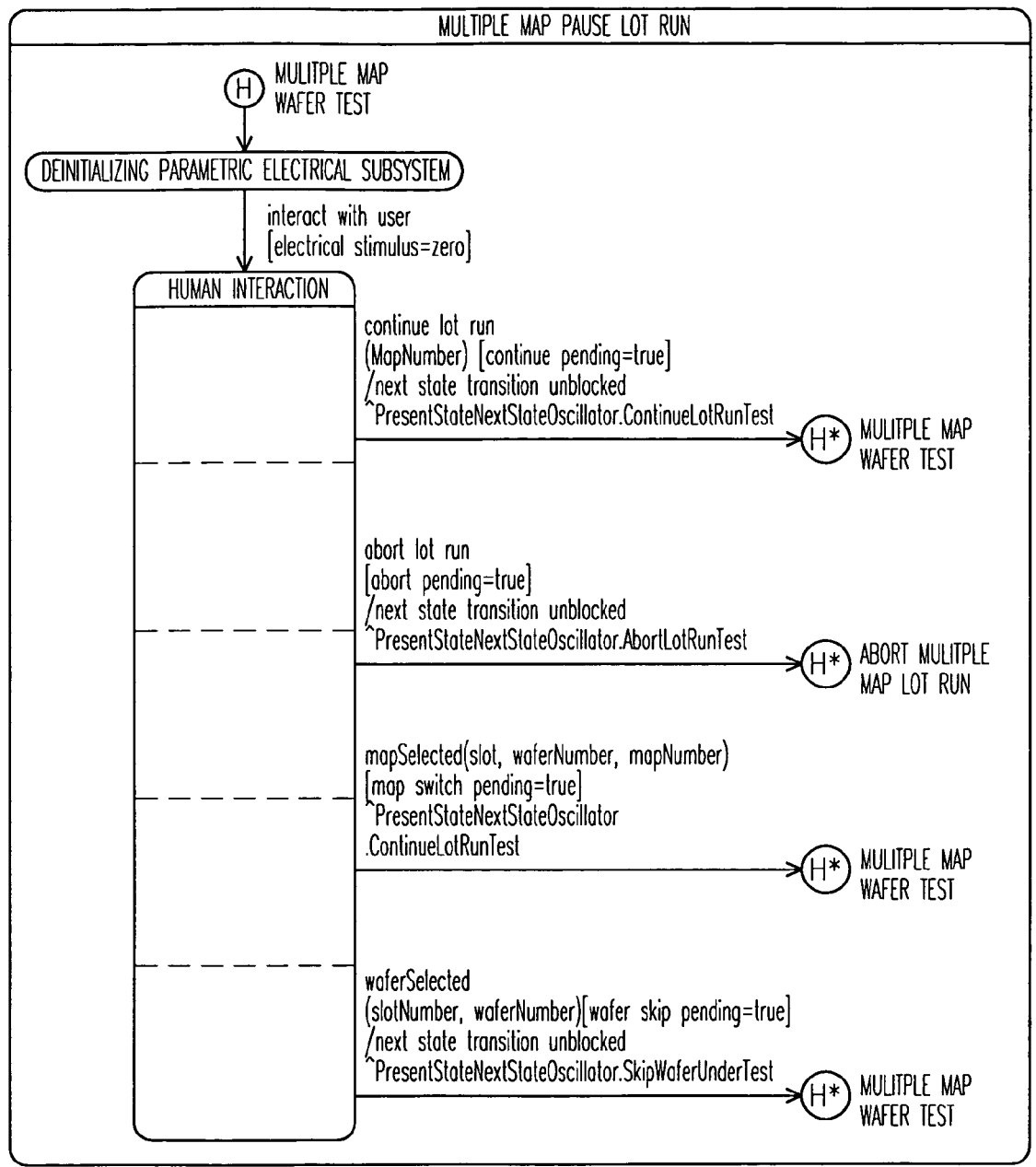
FIG. 16 depicts a composite concurrent state diagram for a Multiple Map Pause Lot Run, according to an embodiment of the invention.
Figure 17:
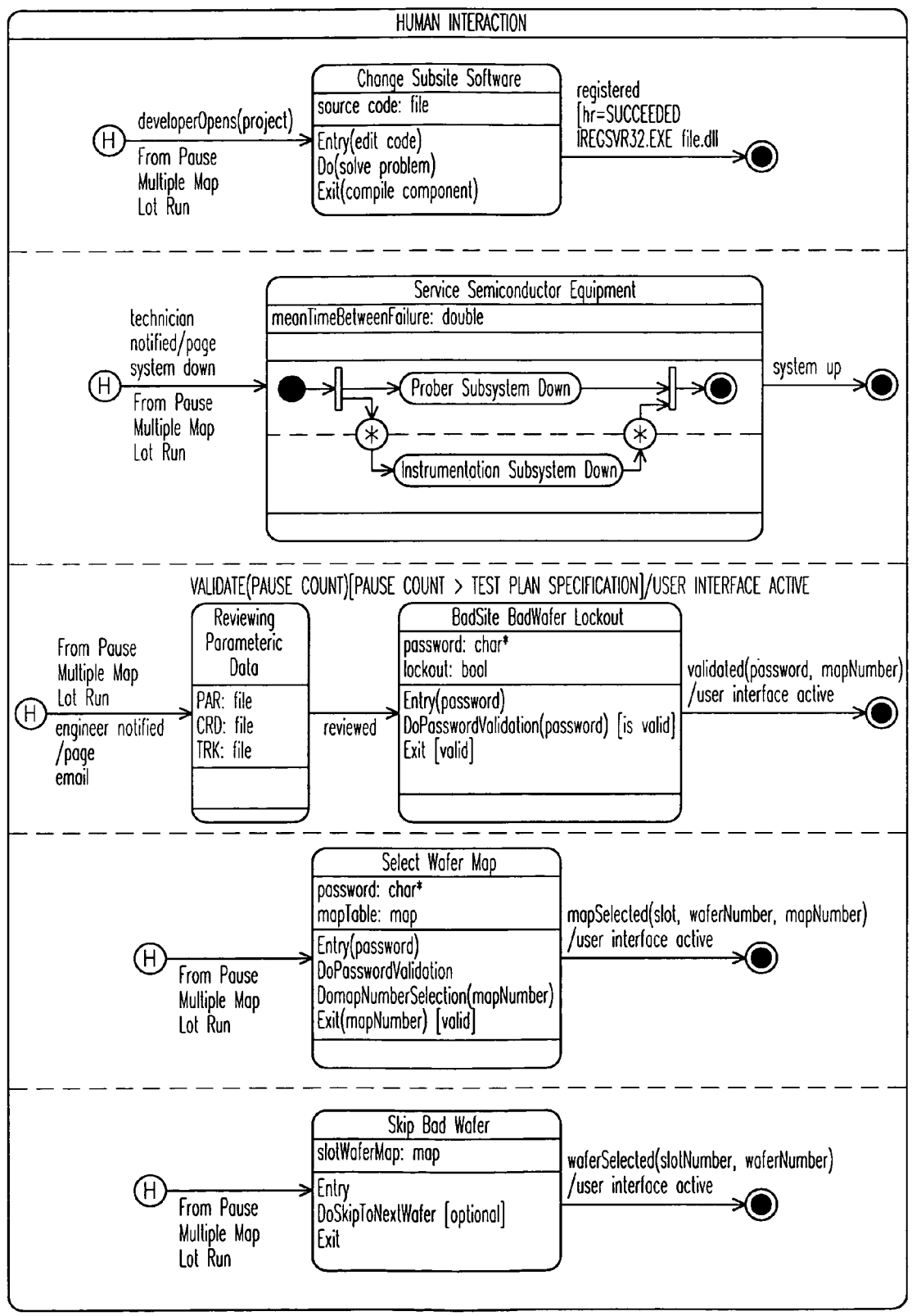
FIG. 17 depicts a composite concurrent state diagram for a Human Interaction, according to an embodiment of the invention.

FIG. 16 and FIG. 17 depict composite concurrent state diagrams for the Multiple Map Pause Lot Run composite state and the Human Interaction. At the paused state, the user may elect to Review Parametric Data, BadSite and BadWafer data during run time, Service Semiconductor Equipment, Change Subsite Test, and Select different Wafer Map for debugging purposes of the new test software. The BadSite and BadWafer lockout mechanism may be password protected, thus not allowing the test station 101 to continue under an operator command. However, it may be disabled according to the FIG. 7B, which allows a smooth transition to the next map when a certain condition holds. The "H" enclosed in a circle denotes the Historical State Pause Multiple Map Lot Run.

Figure 18:
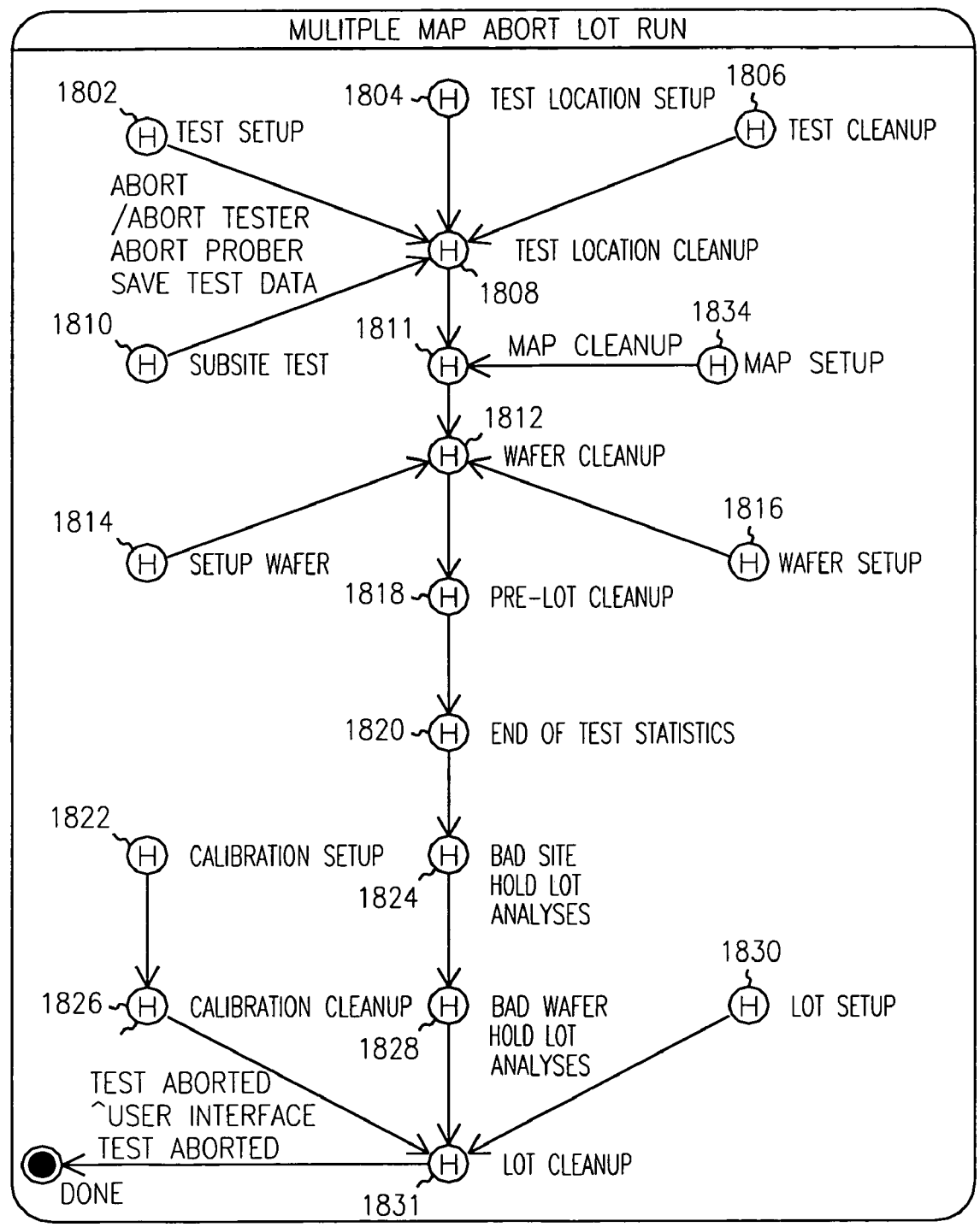
FIG. 18 depicts a detailed state diagram for a Multiple Map Abort Lot Run, according to an embodiment of the invention.

FIG. 18 depicts a detailed state diagram for a Multiple Map Abort Lot Run, according to an embodiment of the invention. The states shown are test setup 1802, test location setup 1804, test cleanup 1806, test location cleanup 1808, subsite test 1810, map cleanup 1811, wafer cleanup 1812, setup wafer 1814, wafer setup 1816, pre-lot cleanup 1818, end of test statistics 1820, calibration setup 1822, bad site hold lot analyses 1824, calibration cleanup 1826, bad wafer hold lot analyses 1828, lot setup 1830, lot cleanup 1831, and map setup 1834.

Figure 19:
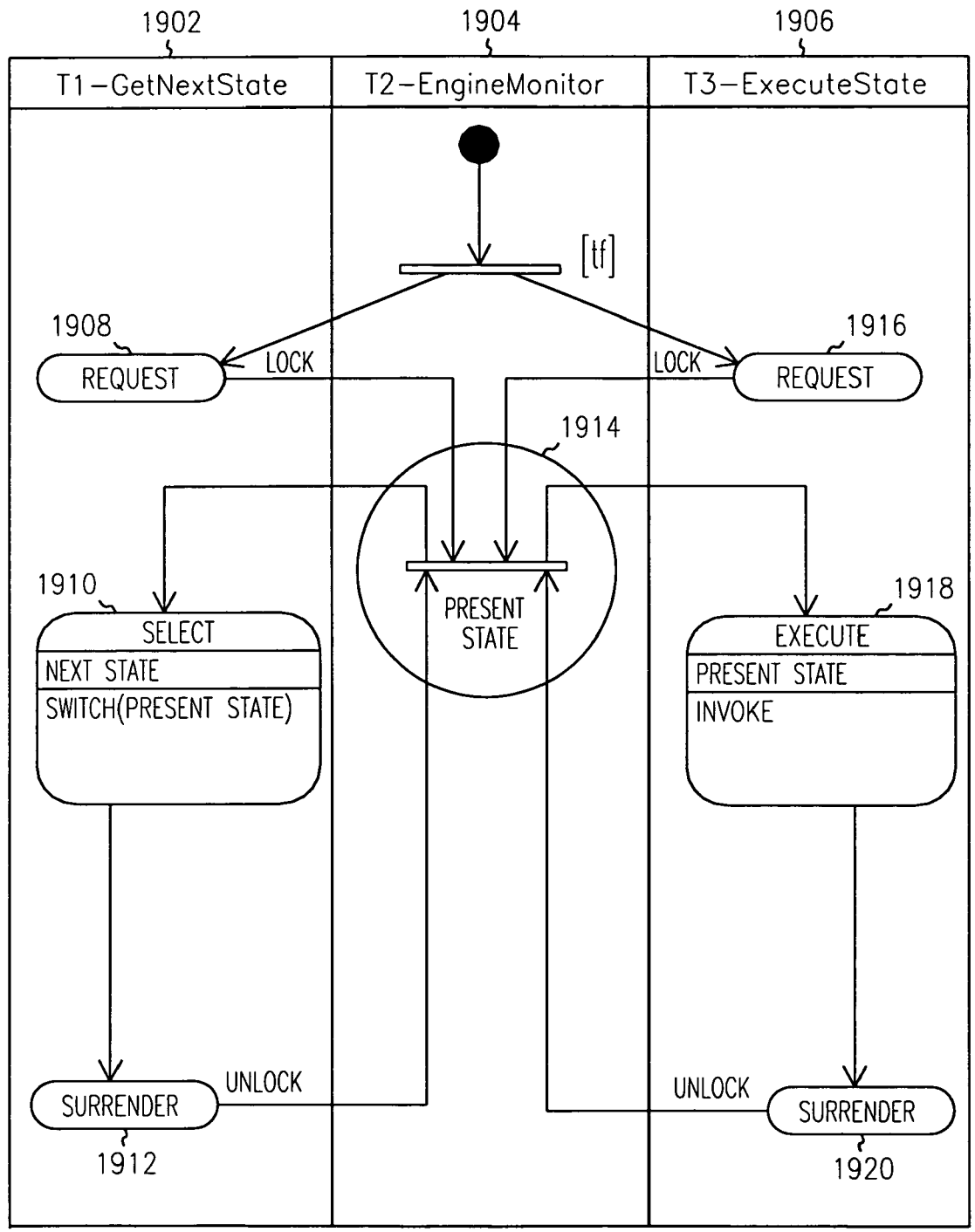
FIG. 19 depicts an activity diagram for a Present-State Next-State Condensed Oscillator, according to an embodiment of the invention.

FIG. 19 depicts an activity diagram for a Present-State Next-State Condensed Oscillator (PSNSO), according to an embodiment of the invention. FIG. 19 depicts a mechanism that permits switching from a present state to a next state. During a state transition, the PSNSO can pause or abort the Multiple Map lot run, for example FIG. 13, FIG. 14, and FIGS. 15A-15F. The activity diagram includes T1-GetNextState 1902, T2-Engine Monitor 1904, and T3-ExecuteState 1906. T1-GetNextState 1902 includes request 1908, select 1910, and surrender 1912. T2-Engine Monitor 1904 includes present state 1914. T3-ExecuteState 1906 includes request 1916, execute 1918, and surrender 1920.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

We claim:

1. A method of parametric testing of semiconductor wafers, comprising:
    loading a first semiconductor wafer onto a probing machine having a probe head;
    loading a first map selected from a plurality of map sets, the first map operable for directing a first sequence of prober movements to perform parametric tests at each location in the first map;
    loading a second map selected from the plurality of map sets, the second map operable for directing a second sequence of prober movements to perform parametric tests at each location in the first map;
    loading a parametric test defect threshold determined from historical data of testing other wafers;
    moving the probe head in the first sequence of prober movements specified in the first map;
    probing test pins with the probe head to perform tests on the wafer at each location in the first probing sequence;
    recording test results of each test at each respective location;
    halting the prober when the test results indicate the defect threshold has been exceeded;
    switching from the first map to the second map;
    moving the probe head in the second sequence of prober movements specified in the second map; and
    recording test results of each test at each respective location.

2. The method of claim 1, wherein the halting occurs prior to completion of the first probing sequence.

3. The method of claim 1, wherein the halting comprises removing electrical test stimuli from the wafer prior to the switching between the maps.

4. The method of claim 1, wherein the switching comprises switching from the first map being a composite wafer map to the second map being an aggregate wafer map.

5. The method of claim 1, wherein the parametric test defect threshold includes a badsite threshold, and further comprising determining the badsite threshold based on a total number of bad sites for the first map and a total number of sites on the first map.

6. The method of claim 1, wherein the parametric test defect threshold includes a badwafer threshold, and further comprising determining the badwafer threshold based on a total number of bad wafers in a lot run and a total number of wafers in the lot run.

7. The method of claim 1, wherein one of the first map and the second map includes a map operable for directing a sequence of prober movements in a serpentine-like prober-movement pattern.

8. The method of claim 1, wherein one of the first map and the second map includes a map operable for directing a sequence of prober movements in a row-by-row prober-movement pattern.

9. The method of claim 1, wherein one of the first map and the second map includes a map operable for directing a sequence of prober movements in a user-defined prober-movement pattern.

10. The method of claim 9, further comprising tailoring the user-defined prober-movement pattern to identify specific process-related problems.

11. A method of parametric testing of semiconductor wafers, comprising:
    loading a first semiconductor wafer onto a probing machine having a probe head;
    loading a plurality of maps each operable for directing a sequence of prober movements to perform parametric tests at each location in that map;
    loading a statistically determined defect threshold;
    moving the probe head in a first sequence of prober movements specified in a first map of the plurality of maps;
    probing test pins with the probe head to perform tests on the wafer at each location in the first sequence of prober movements;
    recording test results of each test at each respective location;
    halting the prober when the test results indicate the defect threshold has been exceeded;
    switching from the first map to a second map of the plurality of maps, the second map different from the first map;
    moving the probe head in a second sequence of prober movements specified in the second map; and recording test results of each test at each respective location.

12. The method of claim 11, wherein the halting occurs prior to completion of the first sequence of prober movements.

13. The method of claim 12, wherein the halting comprises removing electrical test stimuli from the wafer prior to the switching between the maps.

14. The method of claim 13, wherein the switching comprises switching from the first map being a composite wafer map to the second map being an aggregate wafer map.

15. The method of claim 11, wherein the statistically determined defect threshold includes a badsite threshold, and further comprising determining the badsite threshold based on a total number of bad sites for the first map and a total number of sites on the first map.

16. The method of claim 11, wherein the statistically determined defect threshold includes a badwafer threshold, and further comprising determining the badwafer threshold based on a total number of bad wafers in a lot run and a total number of wafers in the lot run.

17. The method of claim 11, wherein the plurality of maps includes a map operable for directing a sequence of prober movements in a serpentine-like prober-movement pattern.

18. The method of claim 11, wherein the plurality of maps includes a map operable for directing a sequence of prober movements in a row-by-row prober-movement pattern.

19. The method of claim 11, wherein the plurality of maps includes a map operable for directing a sequence of prober movements in a user-defined prober-movement pattern.

20. The method of claim 19, further comprising tailoring the user-defined prober-movement pattern to identify specific process-related problems.

* * * * *